(12) United States Patent
Bertness et al.

(10) Patent No.: US 8,198,900 B2
(45) Date of Patent: *Jun. 12, 2012

(54) AUTOMOTIVE BATTERY CHARGING SYSTEM TESTER

(75) Inventors: Kevin I. Bertness, Batavia, IL (US); Michael E. Troy, Lockport, IL (US)

(73) Assignee: Midtronics, Inc., Willowbrook, IL (US)

( * ) Notice: Subject to any disclaimer, the term of this patent is extended or adjusted under 35 U.S.C. 154(b) by 519 days.

This patent is subject to a terminal disclaimer.

(21) Appl. No.: 10/791,141

(22) Filed: Mar. 2, 2004

(65) Prior Publication Data

US 2004/0232918 A1    Nov. 25, 2004

Related U.S. Application Data

(60) Continuation-in-part of application No. 10/098,741, filed on Mar. 14, 2002, now Pat. No. 6,885,195, which is a continuation-in-part of application No. 09/575,629, filed on May 22, 2000, now Pat. No. 6,445,158, which is a continuation-in-part of application No. 09/293,020, filed on Apr. 16, 1999, now Pat. No. 6,351,102, and a continuation-in-part of application No. 09/426,302, filed on Oct. 25, 1999, now Pat. No. 6,091,245, which is a division of application No. 08/681,730, filed on Jul. 29, 1996, now Pat. No. 6,051,976.

(51) Int. Cl.
*G01N 27/416* (2006.01)

(52) U.S. Cl. ......... 324/426; 324/427; 320/104; 320/132

(58) Field of Classification Search .................. 324/426, 324/427; 320/104, 132
See application file for complete search history.

(56) References Cited

U.S. PATENT DOCUMENTS

| 85,553 A | 1/1869 | Adams ............................. 33/472 |
| 2,000,665 A | 5/1935 | Neal .............................. 173/324 |
| 2,417,940 A | 3/1947 | Lehman ..................... 200/61.25 |
| 2,514,745 A | 7/1950 | Dalzell ........................... 171/95 |
| 2,727,221 A | 12/1955 | Springg .......................... 340/447 |
| 3,178,686 A | 4/1965 | Mills ............................. 340/447 |

(Continued)

FOREIGN PATENT DOCUMENTS

DE          29 26 716 B1       1/1981

(Continued)

OTHER PUBLICATIONS

"Dynamic modelling of lead/acid batteries using impedance spectroscopy for parameter identification", Journal of Power Sources, pp. 69-84, (1997).

(Continued)

*Primary Examiner* — Edward Tso
*Assistant Examiner* — Aaron Piggush
(74) *Attorney, Agent, or Firm* — Westman, Champlin & Kelly, P.A.

(57) ABSTRACT

An automotive battery charging system tester for testing the charging system of an automotive vehicle includes AC and DC voltage measurement circuits and a microprocessor controlled testing sequence. The microprocessor is used to perform a series of tests and to instruct an operator to perform steps associated with performing those tests. Through the application of various loads at various engine speeds, the tester is capable of identifying faults in the battery charging system including a bad battery, problems in the alternator or associated electronics, and problems in the starting system.

27 Claims, 8 Drawing Sheets

U.S. PATENT DOCUMENTS

| | | | |
|---|---|---|---|
| 3,223,969 A | 12/1965 | Alexander | 340/447 |
| 3,267,452 A | 8/1966 | Wolf | 340/249 |
| 3,356,936 A | 12/1967 | Smith | 324/29.5 |
| 3,562,634 A | 2/1971 | Latner | 31/4 |
| 3,593,099 A | 7/1971 | Scholl | 320/13 |
| 3,607,673 A | 9/1971 | Seyl | 204/1 |
| 3,652,341 A | 3/1972 | Halsall et al. | 136/176 |
| 3,676,770 A | 7/1972 | Sharaf et al. | 324/29.5 |
| 3,729,989 A | 5/1973 | Little | 73/133 |
| 3,750,011 A | 7/1973 | Kreps | 324/29.5 |
| 3,753,094 A | 8/1973 | Furuishi et al. | 324/29.5 |
| 3,776,177 A | 12/1973 | Bryant et al. | 116/311 |
| 3,796,124 A | 3/1974 | Crosa | 85/36 |
| 3,808,522 A | 4/1974 | Sharaf | 324/29.5 |
| 3,811,089 A | 5/1974 | Strzelewicz | 324/170 |
| 3,816,805 A | 6/1974 | Terry | 320/123 |
| 3,850,490 A | 11/1974 | Zehr | 439/822 |
| 3,873,911 A | 3/1975 | Champlin | 324/29.5 |
| 3,876,931 A | 4/1975 | Godshalk | 324/429 |
| 3,886,426 A | 5/1975 | Daggett | 320/117 |
| 3,886,443 A | 5/1975 | Miyakawa et al. | 324/29.5 |
| 3,889,248 A | 6/1975 | Ritter | 340/249 |
| 3,906,329 A | 9/1975 | Bader | 320/134 |
| 3,909,708 A | 9/1975 | Champlin | 324/29.5 |
| 3,936,744 A | 2/1976 | Perlmutter | 324/158 |
| 3,946,299 A | 3/1976 | Christianson et al. | 320/43 |
| 3,947,757 A | 3/1976 | Grube et al. | 324/28 |
| 3,969,667 A | 7/1976 | McWilliams | 324/29.5 |
| 3,979,664 A | 9/1976 | Harris | 324/17 |
| 3,984,762 A | 10/1976 | Dowgiallo, Jr. | 324/29.5 |
| 3,984,768 A | 10/1976 | Staples | 324/62 |
| 3,989,544 A | 11/1976 | Santo | 429/65 |
| 3,997,830 A | 12/1976 | Newell et al. | 320/102 |
| 4,008,619 A | 2/1977 | Alcaide et al. | 73/398 |
| 4,023,882 A | 5/1977 | Pettersson | 339/96 |
| 4,024,953 A | 5/1977 | Nailor, III | 206/344 |
| 4,047,091 A | 9/1977 | Hutchines et al. | 363/59 |
| 4,053,824 A | 10/1977 | Dupuis et al. | 324/29.5 |
| 4,056,764 A | 11/1977 | Endo et al. | 320/3 |
| 4,057,313 A | 11/1977 | Polizzano | 439/219 |
| 4,070,624 A | 1/1978 | Taylor | 327/158 |
| 4,086,531 A | 4/1978 | Bernier | 324/158 |
| 4,106,025 A | 8/1978 | Katz | 343/715 |
| 4,112,351 A | 9/1978 | Back et al. | 324/16 |
| 4,114,083 A | 9/1978 | Benham et al. | 320/39 |
| 4,126,874 A | 11/1978 | Suzuki et al. | 354/60 |
| 4,160,916 A | 7/1979 | Papasideris | 307/10 |
| 4,178,546 A | 12/1979 | Hulls et al. | 324/158 |
| 4,193,025 A | 3/1980 | Frailing et al. | 324/427 |
| 4,207,611 A | 6/1980 | Gordon | 364/580 |
| 4,217,645 A | 8/1980 | Barry et al. | 364/483 |
| 4,280,457 A | 7/1981 | Bloxham | 123/198 |
| 4,297,639 A | 10/1981 | Branham | 324/429 |
| 4,315,204 A | 2/1982 | Sievers et al. | 322/28 |
| 4,316,185 A | 2/1982 | Watrous et al. | 340/636 |
| 4,322,685 A | 3/1982 | Frailing et al. | 324/429 |
| 4,351,405 A | 9/1982 | Fields et al. | 180/65 |
| 4,352,067 A | 9/1982 | Ottone | 324/434 |
| 4,360,780 A | 11/1982 | Skutch, Jr. | 324/437 |
| 4,361,809 A | 11/1982 | Bil et al. | 324/426 |
| 4,363,407 A | 12/1982 | Barkler et al. | 209/3.3 |
| 4,369,407 A | 1/1983 | Korbell | 324/416 |
| 4,379,989 A | 4/1983 | Kurz et al. | 320/26 |
| 4,379,990 A | 4/1983 | Sievers et al. | 322/99 |
| 4,385,269 A | 5/1983 | Aspinwall et al. | 320/14 |
| 4,390,828 A | 6/1983 | Converse et al. | 320/32 |
| 4,392,101 A | 7/1983 | Saar et al. | 320/20 |
| 4,396,880 A | 8/1983 | Windebank | 320/21 |
| 4,408,157 A | 10/1983 | Beaubien | 324/62 |
| 4,412,169 A | 10/1983 | Dell'Orto | 320/64 |
| 4,423,378 A | 12/1983 | Marino et al. | 324/427 |
| 4,423,379 A | 12/1983 | Jacobs et al. | 324/429 |
| 4,424,491 A | 1/1984 | Bobbett et al. | 324/433 |
| 4,441,359 A | 4/1984 | Ezoe | 73/116.06 |
| 4,459,548 A | 7/1984 | Lentz et al. | 324/158 |
| 4,514,694 A | 4/1985 | Finger | 324/429 |
| 4,520,353 A | 5/1985 | McAuliffe | 340/636 |
| 4,521,498 A | 6/1985 | Juergens | 429/59 |
| 4,564,798 A | 1/1986 | Young | 320/6 |
| 4,620,767 A | 11/1986 | Woolf | 339/255 |
| 4,633,418 A | 12/1986 | Bishop | 364/554 |
| 4,637,359 A * | 1/1987 | Cook | 123/179.3 |
| 4,659,977 A | 4/1987 | Kissel et al. | 320/64 |
| 4,663,580 A | 5/1987 | Wortman | 320/35 |
| 4,665,370 A | 5/1987 | Holland | 324/429 |
| 4,667,143 A | 5/1987 | Cooper et al. | 320/22 |
| 4,667,279 A | 5/1987 | Maier | 363/46 |
| 4,678,998 A | 7/1987 | Muramatsu | 324/427 |
| 4,679,000 A | 7/1987 | Clark | 324/428 |
| 4,680,528 A | 7/1987 | Mikami et al. | 320/32 |
| 4,686,442 A | 8/1987 | Radomski | 320/17 |
| 4,697,134 A | 9/1987 | Burkum et al. | 320/48 |
| 4,707,795 A | 11/1987 | Alber et al. | 364/550 |
| 4,709,202 A | 11/1987 | Koenck et al. | 320/43 |
| 4,710,861 A | 12/1987 | Kanner | 363/46 |
| 4,719,428 A | 1/1988 | Liebermann | 324/436 |
| 4,723,656 A | 2/1988 | Kiernan et al. | 206/705 |
| 4,743,855 A | 5/1988 | Randin et al. | 324/430 |
| 4,745,349 A | 5/1988 | Palanisamy et al. | 320/22 |
| 4,773,011 A | 9/1988 | VanHoose | 701/30 |
| 4,781,629 A | 11/1988 | Mize | 439/822 |
| 4,816,768 A | 3/1989 | Champlin | 324/428 |
| 4,820,966 A | 4/1989 | Fridman | 320/32 |
| 4,825,170 A | 4/1989 | Champlin | 324/436 |
| 4,847,547 A | 7/1989 | Eng, Jr. et al. | 320/35 |
| 4,849,700 A | 7/1989 | Morioka et al. | 324/427 |
| 4,874,679 A | 10/1989 | Miyagawa | 429/91 |
| 4,876,495 A | 10/1989 | Palanisamy et al. | 320/18 |
| 4,881,038 A | 11/1989 | Champlin | 324/426 |
| 4,885,523 A | 12/1989 | Koench | 230/131 |
| 4,888,716 A | 12/1989 | Ueno | 364/550 |
| 4,901,007 A | 2/1990 | Sworm | 324/110 |
| 4,907,176 A | 3/1990 | Bahnick et al. | 364/551.01 |
| 4,912,416 A | 3/1990 | Champlin | 324/430 |
| 4,913,116 A | 4/1990 | Katogi et al. | 123/425 |
| 4,926,330 A | 5/1990 | Abe et al. | 364/424.03 |
| 4,929,931 A | 5/1990 | McCuen | 340/636 |
| 4,931,738 A | 6/1990 | MacIntyre et al. | 324/435 |
| 4,932,905 A | 6/1990 | Richards | 439/822 |
| 4,933,845 A | 6/1990 | Hayes | 364/200 |
| 4,934,957 A | 6/1990 | Bellusci | 439/504 |
| 4,937,528 A | 6/1990 | Palanisamy | 324/430 |
| 4,947,124 A | 8/1990 | Hauser | 324/430 |
| 4,949,046 A | 8/1990 | Seyfang | 324/427 |
| 4,956,597 A | 9/1990 | Heavey et al. | 320/14 |
| 4,965,738 A | 10/1990 | Bauer et al. | 320/136 |
| 4,968,941 A | 11/1990 | Rogers | 324/428 |
| 4,968,942 A | 11/1990 | Palanisamy | 324/430 |
| 4,969,834 A | 11/1990 | Johnson | 439/141 |
| 4,983,086 A | 1/1991 | Hatrock | 411/259 |
| 5,004,979 A | 4/1991 | Marino et al. | 324/160 |
| 5,030,916 A | 7/1991 | Bokitch | 324/503 |
| 5,032,825 A | 7/1991 | Xuznicki | 340/636 |
| 5,034,893 A * | 7/1991 | Fisher | 701/99 |
| 5,037,778 A | 8/1991 | Stark et al. | 437/216 |
| 5,047,722 A | 9/1991 | Wurst et al. | 324/430 |
| 5,081,565 A | 1/1992 | Nabha et al. | 362/465 |
| 5,087,881 A | 2/1992 | Peacock | 324/378 |
| 5,095,223 A | 3/1992 | Thomas | 307/110 |
| 5,108,320 A | 4/1992 | Kimber | 439/883 |
| 5,109,213 A | 4/1992 | Williams | 340/447 |
| 5,126,675 A | 6/1992 | Yang | 324/435 |
| 5,130,658 A | 7/1992 | Bohmer | 324/435 |
| 5,140,269 A | 8/1992 | Champlin | 324/433 |
| 5,144,218 A | 9/1992 | Bosscha | 320/44 |
| 5,144,248 A | 9/1992 | Alexandres et al. | 324/428 |
| 5,159,272 A | 10/1992 | Rao et al. | 324/429 |
| 5,160,881 A | 11/1992 | Schramm et al. | 322/7 |
| 5,168,208 A | 12/1992 | Schultz et al. | 322/25 |
| 5,170,124 A | 12/1992 | Blair et al. | 324/434 |
| 5,179,335 A | 1/1993 | Nor | 320/21 |
| 5,194,799 A | 3/1993 | Tomantschger | 320/103 |
| 5,204,611 A | 4/1993 | Nor et al. | 320/21 |
| 5,214,370 A | 5/1993 | Harm et al. | 320/35 |
| 5,214,385 A | 5/1993 | Gabriel et al. | 324/434 |
| 5,241,275 A | 8/1993 | Fang | 324/430 |
| 5,254,952 A | 10/1993 | Salley et al. | 324/429 |

| Patent No. | | Date | Inventor | Class |
|---|---|---|---|---|
| 5,266,880 | A | 11/1993 | Newland | 320/14 |
| 5,278,759 | A | 1/1994 | Berra et al. | 701/1 |
| 5,281,919 | A | 1/1994 | Palanisamy | 324/427 |
| 5,281,920 | A | 1/1994 | Wurst | 324/430 |
| 5,295,078 | A | 3/1994 | Stich et al. | 364/483 |
| 5,298,797 | A | 3/1994 | Redl | 307/246 |
| 5,300,874 | A | 4/1994 | Shimamoto et al. | 320/15 |
| 5,302,902 | A | 4/1994 | Groehl | 324/434 |
| 5,313,152 | A | 5/1994 | Wozniak et al. | 320/118 |
| 5,315,287 | A | 5/1994 | Sol | 340/455 |
| 5,321,626 | A | 6/1994 | Palladino | 364/483 |
| 5,321,627 | A | 6/1994 | Reher | 364/483 |
| 5,323,337 | A | 6/1994 | Wilson et al. | 364/574 |
| 5,325,041 | A | 6/1994 | Briggs | 320/44 |
| 5,331,268 | A | 7/1994 | Patino et al. | 320/20 |
| 5,332,927 | A | 7/1994 | Paul et al. | 307/66 |
| 5,336,993 | A | 8/1994 | Thomas et al. | 324/158.1 |
| 5,338,515 | A | 8/1994 | Dalla Betta et al. | 422/95 |
| 5,339,018 | A | 8/1994 | Brokaw | 320/35 |
| 5,343,380 | A | 8/1994 | Champlin | 363/46 |
| 5,347,163 | A | 9/1994 | Yoshimura | 307/66 |
| 5,352,968 | A | 10/1994 | Reni et al. | 320/35 |
| 5,357,519 | A | 10/1994 | Martin et al. | 371/15.1 |
| 5,365,160 | A | 11/1994 | Leppo et al. | 320/22 |
| 5,365,453 | A | 11/1994 | Startup et al. | 364/481 |
| 5,369,364 | A | 11/1994 | Renirie et al. | 324/430 |
| 5,381,096 | A | 1/1995 | Hirzel | 324/427 |
| 5,387,871 | A | 2/1995 | Tsai | 324/429 |
| 5,402,007 | A | 3/1995 | Center et al. | 290/40 B |
| 5,410,754 | A | 4/1995 | Klotzbach et al. | 370/85.13 |
| 5,412,308 | A | 5/1995 | Brown | 323/267 |
| 5,412,323 | A | 5/1995 | Kato et al. | 324/429 |
| 5,425,041 | A | 6/1995 | Seko et al. | 372/45.01 |
| 5,426,371 | A | 6/1995 | Salley et al. | 324/429 |
| 5,426,416 | A | 6/1995 | Jefferies et al. | 340/664 |
| 5,430,645 | A | 7/1995 | Keller | 364/424.01 |
| 5,432,025 | A | 7/1995 | Cox | 429/65 |
| 5,432,426 | A | 7/1995 | Yoshida | 320/20 |
| 5,434,495 | A | 7/1995 | Toko | 320/44 |
| 5,435,185 | A | 7/1995 | Eagan | 73/587 |
| 5,442,274 | A | 8/1995 | Tamai | 320/23 |
| 5,445,026 | A | 8/1995 | Eagan | 73/591 |
| 5,449,996 | A | 9/1995 | Matsumoto et al. | 320/20 |
| 5,449,997 | A | 9/1995 | Gilmore et al. | 320/39 |
| 5,451,881 | A | 9/1995 | Finger | 324/433 |
| 5,453,027 | A | 9/1995 | Buell et al. | 439/433 |
| 5,457,377 | A | 10/1995 | Jonsson | 320/5 |
| 5,459,660 | A | 10/1995 | Berra | 701/33 |
| 5,469,043 | A | 11/1995 | Cherng et al. | 320/31 |
| 5,485,090 | A | 1/1996 | Stephens | 324/433 |
| 5,488,300 | A | 1/1996 | Jamieson | 324/432 |
| 5,504,674 | A | 4/1996 | Chen et al. | 705/4 |
| 5,508,599 | A | 4/1996 | Koench | 320/30 |
| 5,519,383 | A | 5/1996 | De La Rosa | 340/636 |
| 5,528,148 | A | 6/1996 | Rogers | 324/426 |
| 5,537,967 | A | 7/1996 | Tashiro et al. | 123/792.1 |
| 5,541,489 | A | 7/1996 | Dunstan | 320/2 |
| 5,546,317 | A | 8/1996 | Andrieu | 364/481 |
| 5,548,273 | A | 8/1996 | Nicol et al. | 340/439 |
| 5,550,485 | A | 8/1996 | Falk | 324/772 |
| 5,561,380 | A | 10/1996 | Sway-Tin et al. | 324/509 |
| 5,562,501 | A | 10/1996 | Kinoshita et al. | 439/852 |
| 5,563,496 | A | 10/1996 | McClure | 320/48 |
| 5,572,136 | A | 11/1996 | Champlin | 324/426 |
| 5,573,611 | A | 11/1996 | Koch et al. | 152/152.1 |
| 5,574,355 | A | 11/1996 | McShane et al. | 320/39 |
| 5,578,915 | A | 11/1996 | Crouch, Jr. et al. | 320/48 |
| 5,583,416 | A | 12/1996 | Klang | 320/22 |
| 5,585,416 | A | 12/1996 | Audett et al. | 522/35 |
| 5,585,728 | A | 12/1996 | Champlin | 324/427 |
| 5,589,757 | A | 12/1996 | Klang | 320/22 |
| 5,592,093 | A | 1/1997 | Klingbiel | 324/426 |
| 5,592,094 | A | 1/1997 | Ichikawa | 324/427 |
| 5,596,260 | A | 1/1997 | Moravec et al. | 320/30 |
| 5,596,261 | A | 1/1997 | Suyama | 320/152 |
| 5,598,098 | A | 1/1997 | Champlin | 324/430 |
| 5,602,462 | A | 2/1997 | Stich et al. | 323/258 |
| 5,606,242 | A | 2/1997 | Hull et al. | 320/48 |
| 5,614,788 | A | 3/1997 | Mullins et al. | 315/82 |
| 5,621,298 | A | 4/1997 | Harvey | 320/5 |
| 5,633,985 | A | 5/1997 | Severson et al. | 395/2.76 |
| 5,637,978 | A | 6/1997 | Kellett et al. | 320/2 |
| 5,642,031 | A | 6/1997 | Brotto | 320/21 |
| 5,650,937 | A | 7/1997 | Bounaga | 364/483 |
| 5,652,501 | A | 7/1997 | McClure et al. | 320/17 |
| 5,653,659 | A | 8/1997 | Kunibe et al. | 477/111 |
| 5,654,623 | A | 8/1997 | Shiga et al. | 320/48 |
| 5,656,920 | A | 8/1997 | Cherng et al. | 320/31 |
| 5,661,368 | A | 8/1997 | Deol et al. | 315/82 |
| 5,666,040 | A | 9/1997 | Bourbeau | 320/118 |
| 5,675,234 | A | 10/1997 | Greene | 320/15 |
| 5,677,077 | A | 10/1997 | Faulk | 429/90 |
| 5,684,678 | A | 11/1997 | Barrett | 363/17 |
| 5,691,621 | A | 11/1997 | Phuoc et al. | 320/134 |
| 5,699,050 | A | 12/1997 | Kanazawa | 340/636 |
| 5,701,089 | A | 12/1997 | Perkins | 327/772 |
| 5,705,929 | A | 1/1998 | Caravello et al. | 324/430 |
| 5,707,015 | A | 1/1998 | Guthrie | 241/120 |
| 5,710,503 | A | 1/1998 | Sideris et al. | 320/6 |
| 5,711,648 | A | 1/1998 | Hammerslag | 414/786 |
| 5,712,795 | A | 1/1998 | Layman et al. | 700/297 |
| 5,717,336 | A | 2/1998 | Basell et al. | 324/430 |
| 5,717,937 | A | 2/1998 | Fritz | 395/750.01 |
| 5,721,688 | A | 2/1998 | Bramwell | 324/426 |
| 5,732,074 | A | 3/1998 | Spaur et al. | 370/313 |
| 5,739,667 | A | 4/1998 | Matsuda et al. | 320/5 |
| 5,744,962 | A | 4/1998 | Alber et al. | 324/426 |
| 5,745,044 | A | 4/1998 | Hyatt, Jr. et al. | 340/825.31 |
| 5,747,189 | A | 5/1998 | Perkins | 429/91 |
| 5,747,909 | A | 5/1998 | Syverson et al. | 310/156 |
| 5,747,967 | A | 5/1998 | Muljadi et al. | 320/39 |
| 5,754,417 | A | 5/1998 | Nicollini | 363/60 |
| 5,757,192 | A | 5/1998 | McShane et al. | 324/427 |
| 5,760,587 | A | 6/1998 | Harvey | 324/434 |
| 5,772,468 | A | 6/1998 | Kowalski et al. | 439/506 |
| 5,773,962 | A | 6/1998 | Nor | 20/134 |
| 5,773,978 | A | 6/1998 | Becker | 324/430 |
| 5,778,326 | A | 7/1998 | Moroto et al. | 701/22 |
| 5,780,974 | A | 7/1998 | Pabla et al. | 315/82 |
| 5,780,980 | A | 7/1998 | Naito | 318/139 |
| 5,789,899 | A | 8/1998 | van Phuoc et al. | 320/30 |
| 5,793,359 | A | 8/1998 | Ushikubo | 345/169 |
| 5,796,239 | A | 8/1998 | van Phuoc et al. | 320/107 |
| 5,808,469 | A | 9/1998 | Kopera | 324/43.4 |
| 5,818,201 | A | 10/1998 | Stockstad et al. | 320/119 |
| 5,818,234 | A | 10/1998 | McKinnon | 324/433 |
| 5,820,407 | A | 10/1998 | Morse et al. | 439/504 |
| 5,821,756 | A | 10/1998 | McShane et al. | 324/430 |
| 5,821,757 | A | 10/1998 | Alvarez et al. | 324/434 |
| 5,825,174 | A | 10/1998 | Parker | 324/106 |
| 5,831,435 | A | 11/1998 | Troy | 324/426 |
| 5,832,396 | A | 11/1998 | Moroto et al. | 701/22 |
| 5,850,113 | A | 12/1998 | Weimer et al. | 307/125 |
| 5,862,515 | A | 1/1999 | Kobayashi et al. | 702/63 |
| 5,865,638 | A | 2/1999 | Trafton | 439/288 |
| 5,871,858 | A | 2/1999 | Thomsen et al. | 429/7 |
| 5,872,443 | A | 2/1999 | Williamson | 320/21 |
| 5,872,453 | A | 2/1999 | Shimoyama et al. | 324/431 |
| 5,883,306 | A | 3/1999 | Hwang | 73/146.8 |
| 5,895,440 | A | 4/1999 | Proctor et al. | 702/63 |
| 5,903,716 | A | 5/1999 | Kimber et al. | 395/114 |
| 5,912,534 | A | 6/1999 | Benedict | 315/82 |
| 5,914,605 | A | 6/1999 | Bertness | 324/430 |
| 5,927,938 | A | 7/1999 | Hammerslag | 414/809 |
| 5,929,609 | A | 7/1999 | Joy et al. | 322/25 |
| 5,939,855 | A | 8/1999 | Proctor et al. | 320/104 |
| 5,939,861 | A | 8/1999 | Joko et al. | |
| 5,945,829 | A | 8/1999 | Bertness | 324/430 |
| 5,946,605 | A | 8/1999 | Takahisa et al. | 455/68 |
| 5,950,144 | A | 9/1999 | Hall et al. | 702/108 |
| 5,951,229 | A | 9/1999 | Hammerslag | 414/398 |
| 5,955,951 | A | 9/1999 | Wischerop et al. | 340/572 |
| 5,961,561 | A | 10/1999 | Wakefield, II | 701/29 |
| 5,961,604 | A | 10/1999 | Anderson et al. | 709/229 |
| 5,969,625 | A | 10/1999 | Russo | 340/636 |
| 5,973,598 | A | 10/1999 | Beigel | 340/572.1 |
| 5,978,805 | A | 11/1999 | Carson | 707/10 |
| 5,982,138 | A | 11/1999 | Krieger | 320/105 |

| | | | |
|---|---|---|---|
| 5,990,664 A | 11/1999 | Rahman | 320/136 |
| 6,002,238 A | 12/1999 | Champlin | 320/134 |
| 6,005,489 A | 12/1999 | Siegle et al. | 340/825.69 |
| 6,005,759 A | 12/1999 | Hart et al. | 361/66 |
| 6,008,652 A | 12/1999 | Theofanopoulos et al. | 324/434 |
| 6,009,369 A | 12/1999 | Boisvert et al. | 701/99 |
| 6,016,047 A | 1/2000 | Notten et al. | 320/137 |
| 6,031,354 A | 2/2000 | Wiley et al. | 320/116 |
| 6,031,368 A | 2/2000 | Klippel et al. | 324/133 |
| 6,037,745 A | 3/2000 | Koike et al. | 320/104 |
| 6,037,749 A * | 3/2000 | Parsonage | 320/132 |
| 6,037,751 A | 3/2000 | Klang | 320/160 |
| 6,037,777 A | 3/2000 | Champlin | 324/430 |
| 6,037,778 A | 3/2000 | Makhija | 324/433 |
| 6,046,514 A | 4/2000 | Rouillard et al. | 307/77 |
| 6,051,976 A | 4/2000 | Bertness | 324/426 |
| 6,055,468 A | 4/2000 | Kaman et al. | 701/29 |
| 6,061,638 A | 5/2000 | Joyce | 702/63 |
| 6,064,372 A | 5/2000 | Kahkoska | 345/173 |
| 6,072,299 A | 6/2000 | Kurle et al. | 320/112 |
| 6,072,300 A | 6/2000 | Tsuji | 320/116 |
| 6,075,339 A | 6/2000 | Reipur et al. | 320/110 |
| 6,081,098 A | 6/2000 | Bertness et al. | 320/134 |
| 6,081,109 A | 6/2000 | Seymour et al. | 324/127 |
| 6,087,815 A | 7/2000 | Pfeifer et al. | 323/282 |
| 6,091,238 A | 7/2000 | McDermott | 324/207.2 |
| 6,091,245 A | 7/2000 | Bertness | 324/426 |
| 6,094,033 A | 7/2000 | Ding et al. | 320/132 |
| 6,097,193 A | 8/2000 | Bramwell | 324/429 |
| 6,100,670 A | 8/2000 | Levesque | 320/150 |
| 6,100,815 A | 8/2000 | Pailthorp | 324/754.07 |
| 6,104,167 A | 8/2000 | Bertness et al. | 320/132 |
| 6,113,262 A | 9/2000 | Purola et al. | 374/45 |
| 6,114,834 A | 9/2000 | Parise | 320/109 |
| 6,136,914 A | 10/2000 | Hergenrother et al. | 524/495 |
| 6,137,269 A | 10/2000 | Champlin | 320/150 |
| 6,140,797 A | 10/2000 | Dunn | 320/105 |
| 6,144,185 A | 11/2000 | Dougherty et al. | 320/132 |
| 6,147,598 A | 11/2000 | Murphy et al. | 340/426.19 |
| 6,150,793 A | 11/2000 | Lesesky et al. | 320/104 |
| 6,158,000 A | 12/2000 | Collins | 713/1 |
| 6,161,640 A | 12/2000 | Yamaguchi | 180/65.8 |
| 6,163,156 A | 12/2000 | Bertness | 324/426 |
| 6,164,063 A | 12/2000 | Mendler | 60/274 |
| 6,167,349 A | 12/2000 | Alvarez | 702/63 |
| 6,172,483 B1 | 1/2001 | Champlin | 320/134 |
| 6,172,505 B1 | 1/2001 | Bertness | 324/430 |
| 6,177,737 B1 | 1/2001 | Palfey et al. | 307/64 |
| 6,181,545 B1 | 1/2001 | Amatucci et al. | 361/502 |
| 6,184,656 B1 | 2/2001 | Karunasiri et al. | 320/119 |
| 6,191,557 B1 | 2/2001 | Gray et al. | 320/132 |
| 6,211,651 B1 | 4/2001 | Nemoto | 320/133 |
| 6,215,275 B1 | 4/2001 | Bean | 320/106 |
| 6,218,805 B1 | 4/2001 | Melcher | 320/105 |
| 6,218,936 B1 | 4/2001 | Imao | 340/447 |
| 6,222,342 B1 | 4/2001 | Eggert et al. | 320/105 |
| 6,222,369 B1 | 4/2001 | Champlin | 324/430 |
| D442,503 S | 5/2001 | Lundbeck et al. | D10/77 |
| 6,225,808 B1 | 5/2001 | Varghese et al. | 324/426 |
| 6,236,186 B1 | 5/2001 | Helton et al. | 320/106 |
| 6,236,332 B1 | 5/2001 | Conkright et al. | 340/825.06 |
| 6,236,949 B1 | 5/2001 | Hart | 702/64 |
| 6,238,253 B1 | 5/2001 | Qualls | 439/759 |
| 6,242,887 B1 | 6/2001 | Burke | 320/104 |
| 6,249,124 B1 | 6/2001 | Bertness | 324/426 |
| 6,250,973 B1 | 6/2001 | Lowery et al. | 439/763 |
| 6,254,438 B1 | 7/2001 | Gaunt | 439/755 |
| 6,259,170 B1 | 7/2001 | Limoge et al. | 307/10.8 |
| 6,259,254 B1 | 7/2001 | Klang | 324/427 |
| 6,262,563 B1 | 7/2001 | Champlin | 320/134 |
| 6,263,268 B1 | 7/2001 | Nathanson | 701/29 |
| 6,271,643 B1 | 8/2001 | Becker et al. | 320/112 |
| 6,271,748 B1 | 8/2001 | Derbyshire et al. | 340/442 |
| 6,275,008 B1 | 8/2001 | Arai et al. | 320/132 |
| 6,285,191 B1 | 9/2001 | Gollomp et al. | 324/427 |
| 6,294,896 B1 | 9/2001 | Champlin | 320/134 |
| 6,294,897 B1 | 9/2001 | Champlin | 320/153 |
| 6,304,087 B1 | 10/2001 | Bertness | 324/426 |
| 6,307,349 B1 | 10/2001 | Koenck et al. | 320/112 |
| 6,310,481 B2 | 10/2001 | Bertness | 324/430 |
| 6,313,607 B1 | 11/2001 | Champlin | 320/132 |
| 6,313,608 B1 | 11/2001 | Varghese et al. | 32/132 |
| 6,316,914 B1 | 11/2001 | Bertness | 320/134 |
| 6,320,351 B1 | 11/2001 | Ng et al. | 320/104 |
| 6,323,650 B1 | 11/2001 | Bertness et al. | 324/426 |
| 6,324,042 B1 | 11/2001 | Andrews | 361/93.2 |
| 6,329,793 B1 | 12/2001 | Bertness et al. | 320/132 |
| 6,331,762 B1 | 12/2001 | Bertness | 320/134 |
| 6,332,113 B1 | 12/2001 | Bertness | 702/63 |
| 6,346,795 B2 | 2/2002 | Haraguchi et al. | 320/136 |
| 6,347,958 B1 | 2/2002 | Tsai | 439/488 |
| 6,351,102 B1 | 2/2002 | Troy | 320/139 |
| 6,356,042 B1 | 3/2002 | Kahlon et al. | 318/138 |
| 6,356,083 B1 | 3/2002 | Ying | 324/426 |
| 6,359,441 B1 | 3/2002 | Bertness | 324/426 |
| 6,359,442 B1 | 3/2002 | Henningson et al. | 324/426 |
| 6,363,303 B1 | 3/2002 | Bertness | 701/29 |
| RE37,677 E | 4/2002 | Irie | 315/83 |
| 6,377,031 B1 | 4/2002 | Karuppana et al. | 323/220 |
| 6,384,608 B1 | 5/2002 | Namaky | 324/430 |
| 6,388,448 B1 | 5/2002 | Cervas | 324/426 |
| 6,392,414 B2 | 5/2002 | Bertness | 324/429 |
| 6,396,278 B1 | 5/2002 | Makhija | 324/402 |
| 6,407,554 B1 | 6/2002 | Godau et al. | 324/503 |
| 6,411,098 B1 | 6/2002 | Laletin | 324/426 |
| 6,417,669 B1 | 7/2002 | Champlin | 324/426 |
| 6,420,852 B1 | 7/2002 | Sato | 320/134 |
| 6,424,157 B1 * | 7/2002 | Gollomp et al. | 324/430 |
| 6,424,158 B2 | 7/2002 | Klang | 324/433 |
| 6,437,957 B1 | 8/2002 | Karuppana et al. | 361/78 |
| 6,441,585 B1 | 8/2002 | Bertness | 320/132 |
| 6,445,158 B1 | 9/2002 | Bertness et al. | 320/104 |
| 6,449,726 B1 | 9/2002 | Smith | 713/340 |
| 6,456,036 B1 | 9/2002 | Thandiwe | 320/106 |
| 6,456,045 B1 | 9/2002 | Troy et al. | 320/139 |
| 6,465,908 B1 | 10/2002 | Karuppana et al. | 307/31 |
| 6,466,025 B1 | 10/2002 | Klang | 324/429 |
| 6,466,026 B1 | 10/2002 | Champlin | 324/430 |
| 6,469,511 B1 | 10/2002 | Vonderhaar et al. | 324/425 |
| 6,477,478 B1 | 11/2002 | Jones et al. | 702/102 |
| 6,495,990 B2 | 12/2002 | Champlin | 320/132 |
| 6,497,209 B1 | 12/2002 | Karuppana et al. | 123/179.3 |
| 6,500,025 B1 | 12/2002 | Moenkhaus et al. | 439/502 |
| 6,505,507 B1 | 1/2003 | Imao et al. | 73/146.5 |
| 6,507,196 B2 | 1/2003 | Thomsen et al. | 324/436 |
| 6,526,361 B1 | 2/2003 | Jones et al. | 702/63 |
| 6,529,723 B1 | 3/2003 | Bentley | 455/405 |
| 6,531,848 B1 | 3/2003 | Chitsazan et al. | 320/153 |
| 6,532,425 B1 | 3/2003 | Boost et al. | 702/63 |
| 6,534,992 B2 | 3/2003 | Meissner et al. | 324/426 |
| 6,534,993 B2 | 3/2003 | Bertness | 324/433 |
| 6,536,536 B1 | 3/2003 | Gass et al. | 173/2 |
| 6,544,078 B2 | 4/2003 | Palmisano et al. | 439/762 |
| 6,545,599 B2 | 4/2003 | Derbyshire et al. | 340/442 |
| 6,556,019 B2 | 4/2003 | Bertness | 324/426 |
| 6,566,883 B1 | 5/2003 | Vonderhaar et al. | 324/426 |
| 6,570,385 B1 * | 5/2003 | Roberts et al. | 324/378 |
| 6,586,941 B2 | 7/2003 | Bertness et al. | 324/426 |
| 6,597,150 B1 | 7/2003 | Bertness et al. | 320/104 |
| 6,599,243 B2 | 7/2003 | Woltermann et al. | 600/300 |
| 6,600,815 B1 | 7/2003 | Walding | 379/93.07 |
| 6,611,740 B2 | 8/2003 | Lowrey et al. | 701/29 |
| 6,614,349 B1 | 9/2003 | Proctor et al. | 340/572.1 |
| 6,618,644 B2 | 9/2003 | Bean | 700/231 |
| 6,621,272 B2 | 9/2003 | Champlin | 324/426 |
| 6,623,314 B1 | 9/2003 | Cox et al. | 439/759 |
| 6,624,635 B1 | 9/2003 | Lui | 324/426 |
| 6,628,011 B2 | 9/2003 | Droppo et al. | 307/43 |
| 6,629,054 B2 | 9/2003 | Makhija et al. | 702/113 |
| 6,633,165 B2 | 10/2003 | Bertness | 324/426 |
| 6,635,974 B1 | 10/2003 | Karuppana et al. | 307/140 |
| 6,667,624 B1 | 12/2003 | Raichle et al. | 324/522 |
| 6,679,212 B2 | 1/2004 | Kelling | 123/179.28 |
| 6,686,542 B2 | 2/2004 | Zhang | 174/74 |
| 6,696,819 B2 | 2/2004 | Bertness | 320/134 |
| 6,707,303 B2 | 3/2004 | Bertness et al. | 324/426 |
| 6,736,941 B2 | 5/2004 | Oku et al. | 203/68 |
| 6,737,831 B2 | 5/2004 | Champlin | 320/132 |

| | | | | | | | |
|---|---|---|---|---|---|---|---|
| 6,738,697 B2 | 5/2004 | Breed | 701/29 | 7,505,856 B2 | 3/2009 | Restaino et al. | 702/63 |
| 6,740,990 B2 | 5/2004 | Tozuka et al. | 307/9.1 | 7,545,146 B2 | 6/2009 | Klang et al. | 324/426 |
| 6,744,149 B1 | 6/2004 | Karuppana et al. | 307/31 | 7,557,586 B1 | 7/2009 | Vonderhaar et al. | 324/437 |
| 6,745,153 B2 | 6/2004 | White et al. | 702/184 | 7,595,643 B2 | 9/2009 | Klang | 324/426 |
| 6,759,849 B2 | 7/2004 | Bertness et al. | 324/426 | 7,598,699 B2 | 10/2009 | Restaino et al. | 320/105 |
| 6,771,073 B2 | 8/2004 | Henningson et al. | 324/426 | 7,598,743 B2 | 10/2009 | Bertness | 324/426 |
| 6,777,945 B2 | 8/2004 | Roberts et al. | 324/426 | 7,598,744 B2 | 10/2009 | Bertness et al. | 324/426 |
| 6,781,382 B2 | 8/2004 | Johnson | 324/426 | 7,619,417 B2 | 11/2009 | Klang | 324/427 |
| 6,784,635 B2 | 8/2004 | Larson | 320/104 | 7,642,786 B2 | 1/2010 | Philbrook | 324/426 |
| 6,788,025 B2 | 9/2004 | Bertness et al. | 320/104 | 7,642,787 B2 | 1/2010 | Bertness et al. | 324/426 |
| 6,795,782 B2 | 9/2004 | Bertness et al. | 702/63 | 7,656,162 B2 | 2/2010 | Vonderhaar et al. | 324/426 |
| 6,796,841 B1 | 9/2004 | Cheng et al. | 439/620.3 | 7,657,386 B2 | 2/2010 | Thibedeau et al. | 702/63 |
| 6,805,090 B2 | 10/2004 | Bertness et al. | 123/198 | 7,679,325 B2 | 3/2010 | Seo | 320/116 |
| 6,806,716 B2 | 10/2004 | Bertness et al. | 324/426 | 7,688,074 B2 | 3/2010 | Cox et al. | 324/426 |
| 6,842,707 B2 | 1/2005 | Raichle et al. | 702/62 | 7,698,179 B2 | 4/2010 | Leung et al. | 705/28 |
| 6,845,279 B1 | 1/2005 | Gilmore et al. | 700/115 | 7,705,602 B2 | 4/2010 | Bertness | 324/426 |
| 6,850,037 B2 | 2/2005 | Bertness | 320/132 | 7,706,991 B2 | 4/2010 | Bertness et al. | 702/63 |
| 6,856,972 B1 | 2/2005 | Yun et al. | 705/36 R | 7,710,119 B2 | 5/2010 | Bertness | 324/426 |
| 6,871,151 B2 | 3/2005 | Bertness | 702/63 | 7,723,993 B2 | 5/2010 | Klang | 324/431 |
| 6,885,195 B2 | 4/2005 | Bertness | 324/426 | 7,728,597 B2 | 6/2010 | Bertness | 324/426 |
| 6,888,468 B2 | 5/2005 | Bertness | 340/636.15 | 7,772,850 B2 | 8/2010 | Bertness | 324/426 |
| 6,891,378 B2 | 5/2005 | Bertness et al. | 324/426 | 7,774,151 B2 | 8/2010 | Bertness | 702/63 |
| 6,904,796 B2 | 6/2005 | Pacsai et al. | 73/146.8 | 7,777,612 B2 | 8/2010 | Sampson et al. | 340/426.1 |
| 6,906,522 B2 | 6/2005 | Bertness et al. | 324/426 | 7,791,348 B2 | 9/2010 | Brown et al. | 324/426 |
| 6,906,523 B2 | 6/2005 | Bertness et al. | 324/426 | 7,808,375 B2 | 10/2010 | Bertness et al. | 340/455 |
| 6,906,624 B2 | 6/2005 | McClelland et al. | 340/442 | 7,883,002 B2 | 2/2011 | Jin et al. | 235/376 |
| 6,909,287 B2 | 6/2005 | Bertness | 324/427 | 7,924,015 B2 | 4/2011 | Bertness | 324/427 |
| 6,913,483 B2 | 7/2005 | Restaino et al. | 439/504 | 2001/0035737 A1 | 11/2001 | Nakanishi et al. | 320/122 |
| 6,914,413 B2 | 7/2005 | Bertness et al. | 320/104 | 2002/0004694 A1 | 1/2002 | McLeod | 701/29 |
| 6,919,725 B2 | 7/2005 | Bertness et al. | 324/433 | 2002/0010558 A1 | 1/2002 | Bertness et al. | 702/63 |
| 6,930,485 B2 | 8/2005 | Bertness et al. | 324/426 | 2002/0021135 A1 | 2/2002 | Li et al. | 324/677 |
| 6,933,727 B2 | 8/2005 | Bertness et al. | 324/426 | 2002/0030495 A1 | 3/2002 | Kechmire | 324/427 |
| 6,941,234 B2 | 9/2005 | Bertness et al. | 702/63 | 2002/0041175 A1 | 4/2002 | Lauper et al. | 320/106 |
| 6,967,484 B2 | 11/2005 | Bertness | 324/426 | 2002/0044050 A1 | 4/2002 | Derbyshire et al. | 340/442 |
| 6,972,662 B1 | 12/2005 | Ohkawa et al. | 340/10.1 | 2002/0050163 A1 | 5/2002 | Makhija et al. | 73/116 |
| 6,998,847 B2 | 2/2006 | Bertness et al. | 324/426 | 2002/0074398 A1 | 6/2002 | Lancos et al. | 235/382 |
| 7,003,410 B2 | 2/2006 | Bertness et al. | 702/63 | 2002/0118111 A1 | 8/2002 | Brown et al. | 340/573.1 |
| 7,003,411 B2 | 2/2006 | Bertness | 702/63 | 2002/0171428 A1 | 11/2002 | Bertness | 324/426 |
| 7,012,433 B2 | 3/2006 | Smith et al. | 324/426 | 2002/0176010 A1 | 11/2002 | Wallach et al. | 348/229.1 |
| 7,029,338 B1 | 4/2006 | Orange et al. | 439/755 | 2003/0009270 A1 | 1/2003 | Breed | 701/29 |
| 7,034,541 B2 | 4/2006 | Bertness et al. | 324/426 | 2003/0025481 A1 | 2/2003 | Bertness | 320/155 |
| 7,058,525 B2 | 6/2006 | Bertness et al. | 702/63 | 2003/0036909 A1 | 2/2003 | Kato | 704/275 |
| 7,081,755 B2 | 7/2006 | Klang et al. | 324/426 | 2003/0040873 A1 | 2/2003 | Lesesky et al. | 702/57 |
| 7,089,127 B2 | 8/2006 | Thibedeau et al. | 702/63 | 2003/0078743 A1 | 4/2003 | Bertness et al. | 702/63 |
| 7,098,666 B2 | 8/2006 | Patino | 324/433 | 2003/0088375 A1 | 5/2003 | Bertness et al. | 702/63 |
| 7,102,556 B2 | 9/2006 | White | 341/141 | 2003/0128036 A1 | 7/2003 | Henningson et al. | 324/426 |
| 7,106,070 B2 | 9/2006 | Bertness et al. | 324/538 | 2003/0169018 A1 | 9/2003 | Berels et al. | 320/132 |
| 7,116,109 B2 | 10/2006 | Klang | 324/426 | 2003/0169019 A1 | 9/2003 | Oosaki | 320/132 |
| 7,119,686 B2 | 10/2006 | Bertness et al. | 340/572.1 | 2003/0184262 A1 | 10/2003 | Makhija | 320/130 |
| 7,120,488 B2 | 10/2006 | Nova et al. | 600/2 | 2003/0184306 A1 | 10/2003 | Bertness et al. | 324/426 |
| 7,126,341 B2 | 10/2006 | Bertness et al. | 324/426 | 2003/0187556 A1 | 10/2003 | Suzuki | 701/29 |
| 7,129,706 B2 | 10/2006 | Kalley | 324/426 | 2003/0194672 A1 | 10/2003 | Roberts et al. | 431/196 |
| 7,154,276 B2 | 12/2006 | Bertness | 324/503 | 2003/0197512 A1 | 10/2003 | Miller et al. | 324/426 |
| 7,177,925 B2 | 2/2007 | Carcido et al. | 709/223 | 2003/0212311 A1 | 11/2003 | Nova et al. | 600/300 |
| 7,182,147 B2 | 2/2007 | Cutler et al. | 173/1 | 2003/0214395 A1 | 11/2003 | Flowerday et al. | 340/445 |
| 7,184,905 B2 | 2/2007 | Stefan | 702/63 | 2004/0000590 A1 | 1/2004 | Raichle et al. | 235/462.01 |
| 7,200,424 B2 | 4/2007 | Tischer et al. | 455/567 | 2004/0000891 A1 | 1/2004 | Raichle et al. | 320/107 |
| 7,208,914 B2 | 4/2007 | Klang | 320/132 | 2004/0000893 A1 | 1/2004 | Raichle et al. | 320/135 |
| 7,209,850 B2 | 4/2007 | Brott et al. | 324/426 | 2004/0000913 A1 | 1/2004 | Raichle et al. | 324/426 |
| 7,209,860 B2 | 4/2007 | Trsar et al. | 702/183 | 2004/0000915 A1 | 1/2004 | Raichle et al. | 324/522 |
| 7,212,887 B2 | 5/2007 | Shah et al | 700/276 | 2004/0002824 A1 | 1/2004 | Raichle et al. | 702/63 |
| 7,219,023 B2 | 5/2007 | Banke et al. | 702/58 | 2004/0002825 A1 | 1/2004 | Raichle et al. | 702/63 |
| 7,233,128 B2 | 6/2007 | Brost et al. | 320/132 | 2004/0002836 A1 | 1/2004 | Raichle et al. | 702/188 |
| 7,235,977 B2 | 6/2007 | Koran et al. | 324/426 | 2004/0032264 A1 | 2/2004 | Schoch | 324/426 |
| 7,246,015 B2 | 7/2007 | Bertness et al. | 702/63 | 2004/0044452 A1 | 3/2004 | Bauer et al. | 703/33 |
| 7,272,519 B2 | 9/2007 | Lesesky et al. | 702/63 | 2004/0049361 A1 | 3/2004 | Hamdan et al. | 702/115 |
| 7,287,001 B1 | 10/2007 | Falls et al. | 705/22 | 2004/0051533 A1 | 3/2004 | Namaky | 324/426 |
| 7,295,936 B2 | 11/2007 | Bertness et al. | 702/63 | 2004/0054503 A1 | 3/2004 | Namaky | 702/183 |
| 7,319,304 B2 | 1/2008 | Veloo et al. | 320/134 | 2004/0113588 A1 | 6/2004 | Mikuriya et al. | 320/128 |
| 7,339,477 B2 | 3/2008 | Puzio et al. | 340/572.1 | 2004/0145342 A1 | 7/2004 | Lyon | 320/108 |
| 7,363,175 B2 | 4/2008 | Bertness et al. | 702/63 | 2004/0164706 A1 | 8/2004 | Osborne | 320/116 |
| 7,398,176 B2 | 7/2008 | Bertness | 702/140 | 2004/0178185 A1 | 9/2004 | Yoshikawa et al. | 219/270 |
| 7,408,358 B2 | 8/2008 | Knopf | 324/426 | 2004/0199343 A1 | 10/2004 | Cardinal et al. | 702/63 |
| 7,425,833 B2 | 9/2008 | Bertness et al. | 324/426 | 2004/0227523 A1 | 11/2004 | Namkay | 324/537 |
| 7,446,536 B2 | 11/2008 | Bertness | 324/426 | 2004/0239332 A1 | 12/2004 | Mackel et al. | 324/426 |
| 7,453,238 B2 | 11/2008 | Melichar | 320/132 | 2004/0251876 A1 | 12/2004 | Bertness et al. | 320/136 |
| 7,479,763 B2 | 1/2009 | Bertness | 320/134 | 2005/0007068 A1 | 1/2005 | Johnson et al. | 320/110 |
| 7,498,767 B2 | 3/2009 | Brown et al. | 320/107 | 2005/0017726 A1 | 1/2005 | Koran et al. | 324/433 |
| 7,501,795 B2 | 3/2009 | Bertness et al. | 320/134 | 2005/0021294 A1 | 1/2005 | Trsar et al. | 702/183 |

| | | | |
|---|---|---|---|
| 2005/0025299 A1 | 2/2005 | Tischer et al. | 379/199 |
| 2005/0043868 A1 | 2/2005 | Mitcham | 701/29 |
| 2005/0057256 A1 | 3/2005 | Bertness | 324/426 |
| 2005/0073314 A1 | 4/2005 | Bertness et al. | 324/433 |
| 2005/0102073 A1 | 5/2005 | Ingram | 701/29 |
| 2005/0128083 A1 | 6/2005 | Puzio et al. | 340/572.1 |
| 2005/0159847 A1 | 7/2005 | Shah et al. | 700/276 |
| 2005/0168226 A1 | 8/2005 | Quint et al. | 324/426 |
| 2005/0173142 A1 | 8/2005 | Cutler et al. | 173/181 |
| 2005/0182536 A1 | 8/2005 | Doyle et al. | 701/29 |
| 2005/0218902 A1 | 10/2005 | Restaino et al. | 324/433 |
| 2005/0254106 A9 | 11/2005 | Silverbrook et al. | 358/539 |
| 2005/0256617 A1 | 11/2005 | Cawthorne et al. | 701/22 |
| 2005/0258241 A1 | 11/2005 | McNutt et al. | 235/385 |
| 2006/0012330 A1 | 1/2006 | Okumura et al. | 320/103 |
| 2006/0030980 A1 | 2/2006 | St. Denis | 701/29 |
| 2006/0089767 A1 | 4/2006 | Sowa | 701/29 |
| 2006/0217914 A1 | 9/2006 | Bertness | 702/113 |
| 2006/0282323 A1 | 12/2006 | Walker et al. | 705/14 |
| 2007/0024460 A1 | 2/2007 | Clark | 340/663 |
| 2007/0026916 A1 | 2/2007 | Juds et al. | 463/1 |
| 2007/0194791 A1 | 8/2007 | Huang | 324/430 |
| 2008/0303528 A1 | 12/2008 | Kim | 324/430 |
| 2008/0303529 A1 | 12/2008 | Nakamura et al. | 324/433 |
| 2009/0247020 A1 | 10/2009 | Gathman et al. | 439/759 |
| 2010/0145780 A1 | 6/2010 | Nishikawa et al. | 705/14.1 |
| 2010/0314950 A1 | 12/2010 | Rutkowski et al. | 307/125 |
| 2011/0004427 A1 | 1/2011 | Gorbold et al. | 702/63 |

FOREIGN PATENT DOCUMENTS

| | | |
|---|---|---|
| DE | 196 38 324 | 9/1996 |
| EP | 0 022 450 A1 | 1/1981 |
| EP | 0 637 754 A1 | 2/1995 |
| EP | 0 772 056 A1 | 5/1997 |
| EP | 0 982 159 A2 | 3/2000 |
| FR | 2 749 397 | 12/1997 |
| GB | 2 029 586 | 3/1980 |
| GB | 2 088 159 A | 6/1982 |
| GB | 2 246 916 A | 10/1990 |
| GB | 2 275 783 A | 7/1994 |
| GB | 2 387 235 A | 10/2003 |
| JP | 59-17892 | 1/1984 |
| JP | 59-17893 | 1/1984 |
| JP | 59-17894 | 1/1984 |
| JP | 59017894 | 1/1984 |
| JP | 59215674 | 12/1984 |
| JP | 60225078 | 11/1985 |
| JP | 62-180284 | 8/1987 |
| JP | 63027776 | 2/1988 |
| JP | 03274479 | 12/1991 |
| JP | 03282276 | 12/1991 |
| JP | 4-8636 | 1/1992 |
| JP | 04095788 | 3/1992 |
| JP | 04131779 | 5/1992 |
| JP | 04372536 | 12/1992 |
| JP | 05211724 A | 8/1993 |
| JP | 5216550 | 8/1993 |
| JP | 7-128414 | 5/1995 |
| JP | 09061505 | 3/1997 |
| JP | 10056744 | 2/1998 |
| JP | 10232273 | 9/1998 |
| JP | 11103503 A | 4/1999 |
| JP | 11-150809 | 6/1999 |
| RU | 2089015 C1 | 8/1997 |
| WO | WO 93/22666 | 11/1993 |
| WO | WO 94/05069 | 3/1994 |
| WO | WO 96/01456 | 1/1996 |
| WO | WO 96/06747 | 3/1996 |
| WO | WO 96/28846 | 9/1996 |
| WO | WO 97/01103 | 1/1997 |
| WO | WO 97/44652 | 11/1997 |
| WO | WO 98/04910 | 2/1998 |
| WO | WO 98/58270 | 12/1998 |
| WO | WO 99/23738 | 5/1999 |
| WO | WO 99/56121 | 11/1999 |
| WO | WO 00/16083 | 3/2000 |
| WO | WO 00/16614 A1 | 3/2000 |
| WO | WO 00/16615 A1 | 3/2000 |
| WO | WO 00/62049 | 10/2000 |
| WO | WO 00/67359 | 11/2000 |
| WO | WO 01/59443 | 2/2001 |
| WO | WO 01/51947 | 7/2001 |
| WO | WO 03/047064 A3 | 6/2003 |
| WO | WO 03/076960 A1 | 9/2003 |
| WO | WO 2004/047215 A1 | 6/2004 |

OTHER PUBLICATIONS

"A review of impedance measurements for determination of the state-of-charge or state-of-health of secondary batteries", Journal of Power Sources, pp. 59-69, (1998).

"Improved Impedance Spectroscopy Technique for Status Determination of Production Li/SO$_2$ Batteries" Terrill Atwater et al., pp. 10-113, (1992).

"Search Report Under Section 17" for Great Britain Application No. GB0421447.4. (Jan. 28, 2005).

"Results of Discrete Frequency Immittance Spectroscopy (DFIS) Measurements of Lead Acid Batteries", by K.S. Champlin et al., *Proceedings of 23$^{rd}$ International Teleco Conference* (INTELEC), published Oct. 2001, IEE, pp. 433-440.

"Examination Report" from the U.K. Patent Office for U.K. App. No. 0417678.0.

"Notification of Transmittal of the International Search Report or the Declaration", PCT/US02/29461.

"Electrochemical Impedance Spectroscopy in Battery Development and Testing", *Batteries International*, Apr. 1997, pp. 59 and 62-63.

"Battery Impedance", by E. Willihnganz et al., *Electrical Engineering*, Sep. 1959, pp. 922-925.

"Determining the End of Battery Life", by S. DeBardelaben, *IEEE*, 1986, pp. 365-368.

"A Look at the Impedance of a Cell", by S. Debardelaben, *IEEE*, 1988, pp. 394-397.

"The Impedance of Electrical Storage Cells", by N.A. Hampson et al., *Journal of Applied Electrochemistry*, 1980, pp. 3-11.

"A Package for Impedance/Admittance Data Analysis", by B. Boukamp, *Solid State Ionics*, 1986, pp. 136-140.

"Precision of Impedance Spectroscopy Estimates of Bulk, Reaction Rate, and Diffusion Parameters", by J. Macdonald et al., *J. Electroanal, Chem.*, 1991, pp. 1-11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128, 131.

IEEE Recommended Practice for Maintenance, Testings, and Replacement of Large Lead Storage Batteries for Generating Stations and Substations, *The Institute of Electrical and Electronics Engineers, Inc.*, ANSI/IEEE Std. 450-1987, Mar. 9, 1987, pp. 7-15.

"Field and Laboratory Studies to Assess the State of Health of Valve-Regulated Lead Acid Batteries: Part I Conductance/Capacity Correlation Studies", by D. Feder et al., *IEEE*, Aug. 1992, pp. 218-233.

"JIS Japanese Industrial Standard-Lead Acid Batteries for Automobiles", *Japanese Standards Association UDC*, 621.355.2:629.113. 006, Nov. 1995.

"Performance of Dry Cells", by C. Hambuechen, Preprint of *Am. Electrochem. Soc.*, Apr. 18-20, 1912, paper No. 19, pp. 1-5.

"A Bridge for Measuring Storage Battery Resistance", by E. Wilihncanz, *The Electrochemical Society*, preprint 79-20, Apr. 1941, pp. 253-258.

National Semiconductor Corporation, "High Q Notch Filter", Mar. 1969, Linear Brief 5, Mar. 1969.

Burr-Brown Corporation, "Design A 60 Hz Notch Filter with the UAF42", Jan. 1994, AB-071, 1994.

National Semiconductor Corporation, "LMF90-4$^{th}$-Order Elliptic Notch Filter", Dec. 1994, RRD-B30M115, Dec. 1994.

"Alligator Clips with Wire Penetrators" *J.S. Popper, Inc.* product information, downloaded from http://www.jspopper.com/, undated.

"#12: LM78S40 Simple Switcher DC to DC Converter", *ITM e-Catalog*, downloaded from http://www.pcbcafe.com, undated.

"Simple DC-DC Converts Allows Use of Single Battery", *Electronix Express*, downloaded from http://www.elexp.com/t_dc-dc.htm, undated.

"DC-DC Converter Basics", *Power Designers*, downloaded from http://www.powederdesigners.com/InforWeb.design_center/articles/DC-DC/converter.shtm, undated.
"Notification of Transmittal of the International Search Report or the Declaration", PCT/US03/07546.
"Notification of Transmittal of the International Search Report or the Declaration", PCT/US03/06577.
"Notification of Transmittal of the International Search Report or the Declaration", PCT/US03/07837.
"Notification of Transmittal of the International Search Report or the Declaration", PCT/US03/41561.
"Notification of Transmittal of the International Search Report or the Declaration", PCT/US03/27696.
"Programming Training Course, 62-000 Series Smart Engine Analyzer", Testproducts Division, Kalamazoo, Michigan, pp. 1-207, (1984).
"Operators Manual, Modular Computer Analyzer Model MCA 3000", Sun Electric Corporation, Crystal Lake, Illinois, pp. 1-1-14-13, (1991).
"Professional BCS System Analyzer Battery-Charger-Starting", pp. 2-8, (2001).
"Office Action" from corresponding U.S. Appl. No. 10/896,834.
Wikipedia Online Encyclopedia, INDUCTANCE, 2005, http://en.wikipedia.org/wiki/inductance, pp. 1-5, mutual Inductance, pp. 3,4.
Notification of Transmittal of the International Search Report for PCT/US03/30707.
Office Action from related U.S. Appl. No. 08/962,754, filed Nov. 3, 1997, Office action date Aug. 17, 1999, 11 pages.
Office Action from related U.S. Appl. No. 09/703,270, filed Oct. 31, 2000, Office action date Jan. 30, 2002, 6 pages.
Office Action from related U.S. Appl. No. 09/564,740, filed May 4, 2000, Office action date Mar. 28, 2001, 7 pages.
Office Action from related U.S. Appl. No. 10/046,659, filed Oct. 29, 2001, Office action date Jun. 18, 2003, 8 pages.
Office Action from related U.S. Appl. No. 10/441,271, filed May 19, 2003, Office action date Oct. 29, 2008, 7 pages.
Office Action from related U.S. Appl. No. 10/441,271, filed May 19, 2003, Office action date Jun. 16, 2008, 7 pages.
Office Action from related U.S. Appl. No. 10/441,271, filed May 19, 2003, Office action date Dec. 6, 2007, 6 pages.
Office Action from related U.S. Appl. No. 10/441,271, filed May 19, 2003, Office action date Feb. 12, 2007, 10 pages.
Office Action from related U.S. Appl. No. 10/441,271, filed May 19, 2003, Office action date Sep. 1, 2006, 8 pages.
Office Action from related U.S. Appl. No. 10/441,271, filed May 19, 2003, Office action date Feb. 16, 2006, 6 pages.
Office Action from related U.S. Appl. No. 10/441,271, filed May 19, 2003, Office action date Oct. 5, 2005, 5 pages.
Office Action from related U.S. Appl. No. 10/441,271, filed May 19, 2003, Office action date Apr. 22, 2004, 7 pages.
Office Action from related U.S. Appl. No. 10/441,271, filed May 19, 2003, Office action date Aug. 30, 2004, 7 pages.
Office Action from related U.S. Appl. No. 10/441,271, filed May 19, 2003, Office action date Feb. 11, 2004, 7 pages.
Office Action from related U.S. Appl. No. 08/681,730 mailed Apr. 24, 1997.
Office Action from related U.S. Appl. No. 08/681,730 mailed Oct. 24, 1997.
Office Action from related U.S. Appl. No. 08/681,730 mailed Feb. 27, 1998.
Office Action from related U.S. Appl. No. 09/293,020 mailed Dec. 20, 2000.
Office Action from related U.S. Appl. No. 10/098,741 mailed Sep. 17, 2003.
Office Action from related U.S. Appl. No. 10/098,741 mailed Jan. 14, 2004.
Office Action from related U.S. Appl. No. 10/098,741 mailed Jun. 3, 2004.
Office Action from related U.S. Appl. No. 10/791,141 mailed Jun. 8, 2010.
Office Action from related U.S. Appl. No. 10/791,141 mailed Jan. 20, 2010.
Office Action from related U.S. Appl. No. 10/791,141 mailed Jul. 9, 2009.
Office Action from related U.S. Appl. No. 10/791,141 mailed Apr. 2, 2009.
Office Action from related U.S. Appl. No. 10/791,141 mailed Sep. 30, 2008.
Office Action from related U.S. Appl. No. 10/791,141 mailed Jun. 23, 2008.
Office Action from related U.S. Appl. No. 10/791,141 mailed Dec. 17, 2007.
Office Action from related U.S. Appl. No. 10/791,141 mailed Jul. 27, 2007.
Office Action from related U.S. Appl. No. 10/791,141 mailed Dec. 21, 2006.
Office Action from related U.S. Appl. No. 10/791,141 mailed Jun. 23, 2006.
Office Action from related U.S. Appl. No. 10/791,141 mailed Oct. 13, 2010.
Supplementary European Search Report Communication for Appl. No. 99917402.2, dated Sep. 7, 2010.
Notification of Transmittal of the International Search Report for PCT/US03/30707, filed Sep. 30, 2003 and mailed Nov. 24, 2004.
"DSP Applications in Hybrid Electric Vehicle Powertrain," Miller et al., Proceedings of the American Control Conference, San Diego, CA, Jun. 1999; 2 pages.
"Notification of Transmittal of the International Search Report and the Written Opinion of the International Searching Authority, or the Declaration" for PCT/US2008/008702, filed Jul. 2008; 15 pages.
"A Microprocessor-Based Control System for a Near-Term Electric Vehicle," Bimal K. Bose; IEEE Transactions on Industry Applications, vol. IA-17, No. 6, Nov./Dec. 1981; 0093-9994/1100-0626$00.75 © 1981 IEEE, 6 pg.
Notification of Transmittal of the International Search Report and the Written Opinion of the International Searching Authority, or the Declaration for PCT/US2011/038279 filed May 27, 2011, date of mailing Sep. 16, 2011, 12 pages.
U.S. Appl. No. 60/387,912, filed Jun. 13, 2002 which is related to U.S. Patent No. 7,089,127.
"Conductance Testing Compared to Traditional Methods of Evaluating the Capacity of Valve-Regulated Lead-Acid Batteries and Predicting State-of-Health", by D. Feder et al., May 1992, pp. 1-8; (13 total pgs.).
"Field and Laboratory Studies to Assess the State of Health of Valve-Regulated Lead Acid Batteries: Part I-Conductance/Capacity Correlation Studies", by D. Feder at al., Oct. 1992, pp. 1-15; (19 total pgs.).
"Field Application of Conductance Measurements Use to Ascertain Cell/Battery and Inter-Cell Connection State-of-Health in Electric Power Utility Applications", by M. Hlavac et al., Apr. 1993, pp. 1-14; (19 total pgs.).
"Conductance Testing of Standby Batteries in Signaling and Communications Applications for the Purpose of Evaluating Battery State-of-Health", by S. McShane, Apr. 1993, pp. 1-9; (14 total pgs.).
"Condutance Monitoring of Recombination Lead Acid Batteries", by B. Jones, May 1993, pp. 1-6; (11 total pgs.).
"Evaluating the State-of-Health of Lead Acid Flooded and Valve-Regulated Batteries: A Comparison of Conductance Testing vs. Traditional Methods", by M. Hlavac et al., Jun. 1993, pp. 1-15; (20 total pgs.).
"Updated State of Conductance/Capacity Correlation Studies to Determine the State-of-Health of Automotive SLI and Standby Lead Acid Batteries", by D. Feder et al., Sep. 1993, pp. 1-17; (22 total pgs.).
"Field and Laboratory Studies to Access the State-of-Health of Valve-Regulated Lead-Acid Battery Technologies Using Conductance Testing Part II-Further Conductance/Capacity Correlation Studies", by M. Hlavac et al., Sep. 1993, pp. 1-9; (14 total pgs.).
"Field Experience of Testing VRLA Batteries by Measuring Conductance", by M.W. Kniveton, May 1994, pp. 1-4; (9 total pgs.).
"Reducing the Cost of Maintaining VRLA Batteries in Telecom Applications", by M.W. Kniveton, Sep. 1994, pp. 1-5; (10 total pgs.).

"Analysis and Interpretation of Conductance Measurements used to Access the State-of-Health of Valve Regulated Lead Acid Batteries Part III: Analytical Techniques", by M. Hlavac, Nov. 1994, 9 pgs; (13 total pgs.).

"Testing 24 Volt Aircraft Batteries Using Midtronics Conductance Technology", by M. Hlavac et al., Jan. 1995, 9 pgs; (13 total pgs.).

"VRLA Battery Monitoring Using Conductance Technology Part IV: On-Line State-of-Health Monitoring and Thermal Runaway Detection/Prevention", by M. Hlavac et al., Oct. 1995, 9 pgs; (13 total pgs.).

"VRLA Battery Conductance Monitoring Part V: Strategies for VRLA Battery Testing and Monitoring in Telecom Operating Environments", by M. Hlavac et al., Oct. 1996, 9 pgs; (13 total pgs.).

"Midpoint Conductance Technology Used in Telecommunication Stationary Standby Battery Applications Part VI: Considerations for Deployment of Midpoint Conductance in Telecommunications Power Applications", by M. Troy et al., Oct. 1997, 9 pgs; (13 total pgs.).

"Impedance/Conductance Measurements as an Aid to Determining Replacement Strategies", M. Kniveton, Sep. 1998, pp. 297-301; (9 total pgs.).

"A Fundamentally New Approach to Battery Performance Analysis Using DFRA™/DTIS™ Technology", by K. Champlin et al., Sep. 2000, 8 pgs; (12 total pgs.).

"Battery State of Health Monitoring, Combining Conductance Technology With Other Measurement Parameters for Real-Time Battery Performance Analysis", by D. Cox et la., Mar. 2000, 6 pgs; (10 total pgs.).

Search Report and Written Opinion from PCT Application No. PCT/US2011/026608, dated Aug. 29, 2011, 9 pgs.

* cited by examiner

AUTOMOTIVE BATTERY CHARGING SYSTEM TESTER

The present application is a Continuation-In-Part of application Ser. No. 10/098,741, filed Mar. 14, 2002 which is a Continuation-In-Part of U.S. patent application Ser. No. 09/575,629, filed May 22, 2000, now U.S. Pat. No. 6,445,158, which is a Continuation-In-Part of Ser. No. 09/293,020, filed Apr. 16, 1999, now U.S. Pat. No. 6,351,102; application Ser. No. 09/575,629 is also a Continuation-In-Part of Ser. No. 09/426,302, filed Oct. 25, 1999, now U.S. Pat. No. 6,091,245; which is a Divisional of Ser. No. 08/681,730, filed Jul. 29, 1996, now U.S. Pat. No. 6,051,976, the contents of which are hereby incorporated by reference in their entirety.

BACKGROUND OF THE INVENTION

The present invention relates to devices for testing an automotive vehicle. More specifically, the present invention relates to a battery charging system tester for an automotive vehicle.

Automotive vehicles include a storage battery for operating electronics in the vehicle and using an electric starter to start the vehicle engine. A battery charging system is coupled to the engine and is powered by the engine when the vehicle is running. The charging system is used to charge the storage battery when the vehicle is operating.

Many attempts have been made to test the battery of the vehicle. One technique which has been pioneered by Dr. Keith S. Champlin and Midtronics, Inc. of Burr Ridge, Ill. relates to measuring the conductance of batteries to determine their condition. This technique is described in a number of U.S. patents, for example, U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/ CELL CAPACITY; U.S. Pat. No. 5,343,380, issued Aug. 30, 1994, entitled METHOD AND APPARATUS FOR SUPPRESSING TIME-VARYING SIGNALS IN BATTERIES UNDERGOING CHARGING OR DISCHARGING; U.S. Pat. No. 5,572,11, issued Nov. 5, 1996, entitled ELECTRONIC BATTERY TESTER DEVICE; U.S. Pat. No. 5,574, 355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,416, issued Dec. 10, 1996, entitled APPARATUS AND METHOD FOR STEP-CHARGING BATTERIES TO OPTIMIZE CHARGE ACCEPTANCE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,589,757, issued Dec. 31, 1996, entitled APPARATUS AND METHOD FOR STEP-CHARGING BATTERIES TO OPTIMIZE CHARGE ACCEPTANCE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,656,920, issued Aug. 12, 1997, entitled METHOD FOR OPTIMIZING THE CHARGING LEAD-ACID BATTERIES AND AN INTERACTIVE CHARGER; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,751, issued Mar. 14, 2000, entitled APPARATUS FOR CHARGING BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; U.S. Pat. No. 6,051,976, issued Apr. 18, 2000, entitled METHOD AND APPARATUS FOR AUDITING A BATTERY TEST; U.S. Pat. No. 6,081,098, issued Jun. 27, 2000, entitled METHOD AND APPARATUS FOR CHARGING A BATTERY; U.S. Pat. No. 6,091,245, issued Jul. 18, 2000, entitled METHOD AND APPARATUS FOR AUDITING A BATTERY TEST; U.S. Pat. No. 6,104,167, issued Aug. 15, 2000, entitled METHOD AND APPARATUS FOR CHARGING A BATTERY; U.S. Pat. No. 6,137,269, issued Oct. 24, 2000, entitled METHOD AND APPARATUS FOR ELECTRONICALLY EVALUATING THE INTERNAL TEMPERATURE OF AN ELECTROCHEMICAL CELL OR BATTERY; U.S. Pat. No. 6,163,156, issued Dec. 19, 2000, entitled ELECTRICAL CONNECTION FOR ELECTRONIC BATTERY TESTER; U.S. Pat. No. 6,172,483, issued Jan. 9, 2001, entitled METHOD AND APPARATUS FOR MEASURING COMPLEX IMPEDANCE OF CELLS AND BATTERIES; U.S. Pat. No. 6,172,505, issued Jan. 9, 2001, entitled ELECTRONIC BATTERY TESTER; U.S. Pat. No. 6,222,19, issued Apr. 24, 2001, entitled METHOD AND APPARATUS FOR DETERMINING BATTERY PROPERTIES FROM COMPLEX IMPEDANCE/ADMITTANCE; U.S. Pat. No. 6,225,808, issued May 1, 2001, entitled TEST COUNTER FOR ELECTRONIC BATTERY TESTER; U.S. Pat. No. 6,249,124, issued Jun. 19, 2001, entitled ELECTRONIC BATTERY TESTER WITH INTERNAL BATTERY; U.S. Pat. No. 6,259,254, issued Jul. 10, 2001, entitled APPARATUS AND METHOD FOR CARRYING OUT DIAGNOSTIC TESTS ON BATTERIES AND FOR RAPIDLY CHARGING BATTERIES; U.S. Pat. No. 6,262,563, issued Jul. 17, 2001, entitled METHOD AND APPARATUS FOR MEASURING COMPLEX ADMITTANCE OF CELLS AND BATTERIES; U.S. Pat. No. 6,294,896, issued Sep. 25, 2001; entitled METHOD AND APPARATUS FOR MEASURING COMPLEX SELF-IMMITANCE OF A GENERAL ELECTRICAL ELEMENT; U.S. Pat. No. 6,294, 897, issued Sep. 25, 2001, entitled METHOD AND APPARATUS FOR ELECTRONICALLY EVALUATING THE INTERNAL TEMPERATURE OF AN ELECTROCHEMI- CAL CELL OR BATTERY; U.S. Pat. No. 6,304,087, issued Oct. 16, 2001, entitled APPARATUS FOR CALIBRATING ELECTRONIC BATTERY TESTER; U.S. Pat. No. 6,310,481, issued Oct. 30, 2001, entitled ELECTRONIC BATTERY TESTER; U.S. Pat. No. 6,313,607, issued Nov. 6, 2001, entitled METHOD AND APPARATUS FOR EVALUATING STORED CHARGE IN AN ELECTROCHEMICAL CELL OR BATTERY; U.S. Pat. No. 6,313,608, issued Nov. 6, 2001, entitled METHOD AND APPARATUS FOR CHARGING A BATTERY; U.S. Pat. No. 6,316,914, issued Nov. 13, 2001, entitled TESTING PARALLEL STRINGS OF STORAGE BATTERIES; U.S. Pat. No. 6,323,650, issued Nov. 27, 2001, entitled ELECTRONIC BATTERY TESTER; U.S. Pat. No. 6,329,793, issued Dec. 11, 2001, entitled METHOD AND APPARATUS FOR CHARGING A BATTERY; U.S. Pat. No. 6,331,762, issued Dec. 18, 2001, entitled ENERGY MANAGEMENT SYSTEM FOR AUTOMOTIVE VEHICLE; U.S. Pat. No. 6,332,113, issued Dec. 18, 2001, entitled ELECTRONIC BATTERY TESTER; U.S. Pat. No. 6,351,102, issued Feb. 26, 2002, entitled AUTOMOTIVE BATTERY CHARGING SYSTEM TESTER; U.S. Pat. No. 6,359,441, issued Mar. 19, 2002, entitled ELECTRONIC BATTERY TESTER; U.S. Pat. No. 6,13,303, issued Mar. 26, 2002, entitled ALTERNATOR DIAGNOSTIC SYSTEM; U.S. Pat. No. 6,392,414, issued May 21, 2002, entitled ELECTRONIC BATTERY TESTER; U.S. Pat. No. 6,417,669, issued Jul. 9, 2002, entitled SUPPRESSING INTERFERENCE IN AC MEASUREMENTS OF CELLS, BATTERIES AND OTHER ELECTRICAL ELEMENTS; U.S. Pat. No. 6,424,158, issued Jul. 23, 2002, entitled APPARATUS AND METHOD FOR CARRYING OUT DIAGNOSTIC TESTS ON BATTERIES AND FOR RAPIDLY CHARGING BATTERIES; U.S. Pat. No. 6,441,585, issued Aug. 17, 2002, entitled APPARATUS AND METHOD FOR TESTING RECHARGEABLE ENERGY STORAGE BATTERIES; U.S. Pat. No. 6,445,158, issued Sep. 3, 2002, entitled VEHICLE ELECTRICAL SYSTEM TESTER WITH ENCODED OUTPUT; U.S. Pat. No. 6,456,045, issued Sep. 24, 2002, entitled INTEGRATED CONDUCTANCE AND LOAD TEST BASED ELECTRONIC BATTERY TESTER; U.S. Pat. No. 6,466,025, issued Oct. 15, 2002, entitled ALTERNATOR TESTER; U.S. Pat. No. 6,466,026, issued Oct. 15, 2002, entitled PROGRAMMABLE CURRENT EXCITER FOR MEASURING AC IMMITTANCE OF CELLS AND BATTERIES; U.S. Pat. No. 6,534,993, issued Mar. 18, 2003, entitled ELECTRONIC BATTERY TESTER; U.S. Pat. No. 6,544,078, issued Apr. 8, 2003, entitled BATTERY CLAMP WITH INTEGRATED CURRENT SENSOR; U.S. Pat. No. 6,556,019, issued Apr. 29, 2003, entitled ELECTRONIC BATTERY TESTER; U.S. Pat. No. 6,566,883, issued May 20, 2003, entitled ELECTRONIC BATTERY TESTER; U.S. Pat. No. 6,586,941, issued Jul. 1, 2003, entitled BATTERY TESTER WITH DATABUS; U.S. Pat. No. 6,597,150, issued Jul. 22, 2003, entitled METHOD OF DISTRIBUTING JUMP-START BOOSTER PACKS; U.S. Pat. No. 6,621,272, issued Sep. 16, 2003, entitled PROGRAMMABLE CURRENT EXCITER FOR MEASURING AC IMMITTANCE OF CELLS AND BATTERIES; U.S. Pat. No. 6,623,314, issued Sep. 23, 2003, entitled KELVIN CLAMP FOR ELECTRICALLY COUPLING TO A BATTERY CONTACT; U.S. Pat. No. 6,633,165, issued Oct. 14, 2003, entitled IN-VEHICLE BATTERY MONITOR; U.S. Pat. No. 6,635,974, issued Oct. 21, 2003, entitled SELF-LEARNING POWER MANAGEMENT SYSTEM AND METHOD; U.S. Ser. No. 09/780,146, filed Feb. 9, 2001, entitled STORAGE BATTERY WITH INTEGRAL BATTERY TESTER; U.S. Ser. No. 09/756,638, filed Jan. 8, 2001, entitled METHOD AND APPARATUS FOR DETERMINING BATTERY PROPERTIES FROM COMPLEX IMPEDANCE/ADMITTANCE; U.S. Ser. No. 09/862,783, filed May 21, 2001, entitled METHOD AND APPARATUS FOR TESTING CELLS AND BATTERIES EMBEDDED IN SERIES/PARALLEL SYSTEMS; U.S. Pat. No. 6,469,511, issued Nov. 22, 2002, entitled BATTERY CLAMP WITH EMBEDDED ENVIRONMENT SENSOR; U.S. Ser. No. 09/880,473, filed Jun. 13, 2001; entitled BATTERY TEST MODULE; U.S. Pat. No. 6,495,990, issued Dec. 17, 2002, entitled METHOD AND APPARATUS FOR EVALUATING STORED CHARGE IN AN ELECTROCHEMICAL CELL OR BATTERY; U.S. Ser. No. 60/348,479, filed Oct. 29, 2001, entitled CONCEPT FOR TESTING HIGH POWER VRLA BATTERIES; U.S. Ser. No. 10/046,659, filed Oct. 29, 2001, entitled ENERGY MANAGEMENT SYSTEM FOR AUTOMOTIVE VEHICLE; U.S. Ser. No. 09/993,468, filed Nov. 14, 2001, entitled KELVIN CONNECTOR FOR A BATTERY POST; U.S. Ser. No. 09/992,350, filed Nov. 26, 2001, entitled ELECTRONIC BATTERY TESTER; U.S. Ser. No. 10/042,451, filed Jan. 8, 2002, entitled BATTERY CHARGE CONTROL DEVICE; U.S. Ser. No. 10/073,378, filed Feb. 8, 2002, entitled METHOD AND APPARATUS USING A CIRCUIT MODEL TO EVALUATE CELL/BATTERY PARAMETERS; U.S. Ser. No. 10/093,853, filed Mar. 7, 2002, entitled ELECTRONIC BATTERY TESTER WITH NETWORK COMMUNICATION; U.S. Ser. No. 10/098,741, filed Mar. 14, 2002, entitled METHOD AND APPARATUS FOR AUDITING A BATTERY TEST; U.S. Ser. No. 10/112,114, filed Mar. 28, 2002, entitled BOOSTER PACK WITH STORAGE CAPACITOR; U.S. Ser. No. 10/109,734, filed Mar. 28, 2002, entitled APPARATUS AND METHOD FOR COUNTERACTING SELF DISCHARGE IN A STORAGE BATTERY; U.S. Ser. No. 10/112,105, filed Mar. 28, 2002, entitled CHARGE CONTROL SYSTEM FOR A VEHICLE BATTERY; U.S. Ser. No. 10/112,998, filed Mar. 29, 2002, entitled BATTERY TESTER WITH BATTERY REPLACEMENT OUTPUT; U.S. Ser. No. 10/119,297, filed Apr. 9, 2002, entitled METHOD AND APPARATUS FOR TESTING CELLS AND BATTERIES EMBEDDED IN SERIES/PARALLEL SYSTEMS; U.S. Ser. No. 60/387,046, filed Jun. 7, 2002, entitled METHOD AND APPARATUS FOR INCREASING THE LIFE OF A STORAGE BATTERY; U.S. Ser. No. 10/177,635, filed Jun. 21, 2002, entitled BATTERY CHARGER WITH BOOSTER PACK; U.S. Ser. No. 10/200,041, filed Jul. 19, 2002, entitled AUTOMOTIVE VEHICLE ELECTRICAL SYSTEM DIAGNOSTIC DEVICE; U.S. Ser. No. 10/217,913, filed Aug. 13, 2002, entitled, BATTERY TEST MODULE; U.S. Ser. No. 10/246,439, filed Sep. 18, 2002, entitled BATTERY TESTER UPGRADE USING SOFTWARE KEY; U.S. Ser. No. 10/263,473, filed Oct. 2, 2002, entitled ELECTRONIC BATTERY TESTER WITH RELATIVE TEST OUTPUT; U.S. Ser. No. 10/271,342, filed Oct. 15, 2002, entitled IN-VEHICLE BATTERY MONITOR; U.S. Ser. No. 10/310,515, filed Dec. 5, 2002, entitled BATTERY TEST MODULE; U.S. Ser. No. 10/310,490, filed Dec. 5, 2002, entitled ELECTRONIC BATTERY TESTER; U.S. Ser. No. 10/310,385, filed Dec. 5, 2002, entitled BATTERY TEST MODULE; U.S. Ser. No. 60/437,224, filed Dec. 31, 2002, entitled DISCHARGE VOLTAGE PREDICTIONS; U.S. Ser. No. 10/349,053, filed Jan. 22, 2003, entitled APPARATUS AND METHOD FOR PROTECTING A BATTERY FROM OVERDISCHARGE; U.S. Ser. No. 10/388,855, filed Mar. 14, 2003, entitled ELECTRONIC BATTERY TESTER WITH BATTERY FAILURE TEMPERATURE DETERMINATION; U.S. Ser. No. 10/396,550, filed Mar. 25, 2003, entitled ELECTRONIC BATTERY TESTER; U.S. Ser. No. 60/467,872, filed May 5, 2003, entitled METHOD FOR DETERMINING BATTERY STATE OF CHARGE; U.S. Ser. No. 60/477,082, filed Jun. 9, 2003, entitled ALTERNATOR TESTER; U.S. Ser. No. 10/460,749, filed Jun. 12, 2003, entitled MODULAR BATTERY TESTER FOR SCAN TOOL; U.S. Ser. No. 10/462,323, filed Jun. 16, 2003, entitled ELECTRONIC BATTERY TESTER HAVING A USER INTERFACE TO CONFIGURE A PRINTER; U.S. Ser. No. 10/601,608, filed Jun. 23, 2003, entitled CABLE FOR ELECTRONIC BATTERY TESTER; U.S. Ser. No. 10/601,432, filed Jun. 23, 2003, entitled BATTERY TESTER CABLE WITH MEMORY; U.S. Ser. No. 60/490,153, filed Jul. 25, 2003, entitled SHUNT CONNECTION TO A PCB FOR AN ENERGY MANAGEMENT SYSTEM EMPLOYED IN AN AUTOMOTIVE VEHICLE; U.S. Ser. No. 10/653,342, filed Sep. 2, 2003, entitled ELECTRONIC BATTERY TESTER CONFIGURED TO PREDICT A LOAD TEST RESULT; U.S. Ser. No. 10/654,098, filed Sep. 3, 2003, entitled BATTERY TEST OUTPUTS ADJUSTED BASED UPON BATTERY TEMPERATURE AND THE STATE OF DISCHARGE OF THE BATTERY; U.S. Ser. No. 10/656,526, filed Sep. 5, 2003, entitled METHOD AND APPARATUS FOR MEASURING A PARAMETER OF A VEHICLE ELECTRICAL SYSTEM; U.S. Ser. No. 10/656,538, filed Sep. 5, 2003, entitled ALTERNATOR TESTER WITH ENCODED OUTPUT; U.S. Ser. No. 10/675,933, filed Sep. 30, 2003, entitled QUERY BASED ELECTRONIC BATTERY TESTER; U.S. Ser. No. 10/678,629, filed Oct. 3, 2003, entitled ELECTRONIC BATTERY TESTER/CHARGER WITH INTEGRATED BATTERY CELL TEMPERATURE MEASUREMENT DEVICE; U.S. Ser. No. 10/441,271, filed May 19, 2003, entitled ELECTRONIC BATTERY TESTER; U.S. Ser. No. 09/653,963, filed Sep. 1, 2000, entitled SYSTEM AND METHOD FOR CONTROLLING POWER GENERATION AND STORAGE; U.S. Ser. No. 09/654,217, filed Sep. 1, 2000, entitled SYSTEM AND METHOD FOR PROVIDING STEP-DOWN POWER CONVERSION USING INTELLIGENT SWITCH; U.S. Pat. No. 6,465,908, issued Oct. 15, 2002, entitled INTELLIGENT POWER MANAGEMENT SYSTEM; U.S. Pat. No. 6,497,209, issued Dec. 24, 2002, entitled SYSTEM AND METHOD FOR PROTECTING A CRANKING SUBSYSTEM; U.S. Pat. No. 6,437,957, issued Aug. 20, 2002, entitled SYSTEM AND METHOD FOR PROVIDING SURGE, SHORT, AND REVERSE POLARITY CONNECTION PROTECTION; U.S. Pat. No. 6,377,031, issued Apr. 23, 2002, entitled INTELLIGENT SWITCH FOR POWER MANAGEMENT; U.S. Ser. No. 10/174,110, filed Jun. 18, 2002, entitled DAYTIME RUNNING LIGHT CONTROL USING AN INTELLIGENT POWER MANAGEMENT SYSTEM; U.S. Ser. No. 60/488,775, filed Jul. 21, 2003, entitled ULTRASONICALLY ASSISTED CHARGING; U.S. Ser. No. 10/258,441, filed Apr. 9, 2003, entitled CURRENT MEASURING CIRCUIT SUITED FOR BATTERIES; U.S. Pat. No. 6,507,196, issued Jan. 14, 2003; entitled BATTERY HAVING DISCHARGE STATE INDICATION; U.S. Pat. No. 5,871,858, issued Feb. 16, 1999, entitled ANTI-THEFT BATTERY; U.S. Ser. No. 10/705,020, filed Nov. 11, 2003, entitled APPARATUS AND METHOD FOR SIMULATING A BATTERY TESTER WITH A FIXED RESISTANCE LOAD; U.S. Ser. No. 10/280,186, filed Oct. 25, 2002, entitled BATTERY TESTER CONFIGURED TO RECEIVE A REMOVABLE DIGITAL MODULE; U.S. Ser. No. 10/681,666, filed Oct. 8, 2003, entitled ELECTRONIC BATTERY TESTER WITH PROBE LIGHT; U.S. Ser. No. 10/748,792, filed Dec. 30, 2003, entitled APPARATUS AND METHOD FOR PREDICTING THE REMAINING DISCHARGE TIME OF A BATTERY; and U.S. Ser. No. 10/767,945, filed Jan. 29, 2004, entitled ELECTRONIC BATTERY TESTER, which are incorporated herein in their entirety.

With the advent of accurate battery testing, it has become apparent that in some instances the battery in the vehicle may be good, and a problem related to the battery charging system is the cause of the perceived battery failure. A vehicle charging system generally includes the battery, an alternator, a regulator and an alternator drive belt. In most modern vehicles, the regulator is built into the alternator housing and is referred to as an internal regulator. The role of the charging system is two fold. First, the alternator provides charging current for the battery. This charging current ensures that the battery remains charged while the vehicle is being driven and therefore will have sufficient capacity to subsequently start the engine. Second, the alternator provides an output current for all of the vehicle electrical loads. In general, the alternator output, the battery capacity, the starter draw and the vehicle electrical load requirements are matched to each other for optimal performance. In a properly functioning charging system, the alternator will be capable of outputting enough current to drive the vehicle electrical loads while simultaneously charging the battery. Typically, alternators range in size from 60 to 120 amps.

A number of charging system testers have been used to evaluate the performance of the vehicle charging system. These testers generally use an inductive "amp clamp." The amp clamp is placed around a cable or wire and inductively couples to the cable or wire such that the current passing through the wire can be measured. This measurement can be made without having to disconnect the wire. In such a system, typically the operator determines the rated size of the alternator. Next, the operator connects the amp clamp to the output cable of the alternator and an electrical load such as a carbon pile load tester, is placed across the battery. This is a large resistive load capable of receiving several hundred amps which will force the alternator to provide its maximum output. The maximum output current can then be measured using the amp clamp connection. If the measured output is less than the rated output, the alternator is determined to be malfunctioning. Such a test is cumbersome as the equipment is large and difficult to handle. Further, it is difficult, particularly with compact engines, to reach the alternator output cable. Further, in some cases, the amp clamp may not fit around the output cable. It is also very easy to place the amp clamp around the wrong cable causing a false test.

Another testing technique is described in U.S. Pat. No. 4,207,611, which issued Jun. 10, 1980 and is entitled APPARATUS AND METHOD FOR CALIBRATED TESTING OF A VEHICLE ELECTRICAL SYSTEM. The device described in this reference monitors voltage changes present at the cigarette lighter of an automotive vehicle in order to determine the condition of the alternator by applying internal loads such as head lamps and blowers, while the engine is running.

SUMMARY OF THE INVENTION

The present invention includes an automotive battery charging system tester for testing the charging system of an automotive vehicle. The tester includes AC and DC voltage measurement circuits and a microprocessor controlled testing sequence. The microprocessor is used to perform a series of tests and instruct an operator to perform steps associated with those tests. Through the application of various loads at various engine speeds, the tester is capable of identifying faults in the battery charging system including a bad battery, problems in the alternator or associated electronics, and problems in the starting system.

DETAILED DESCRIPTION OF THE PREFERRED EMBODIMENTS

Figure 1:
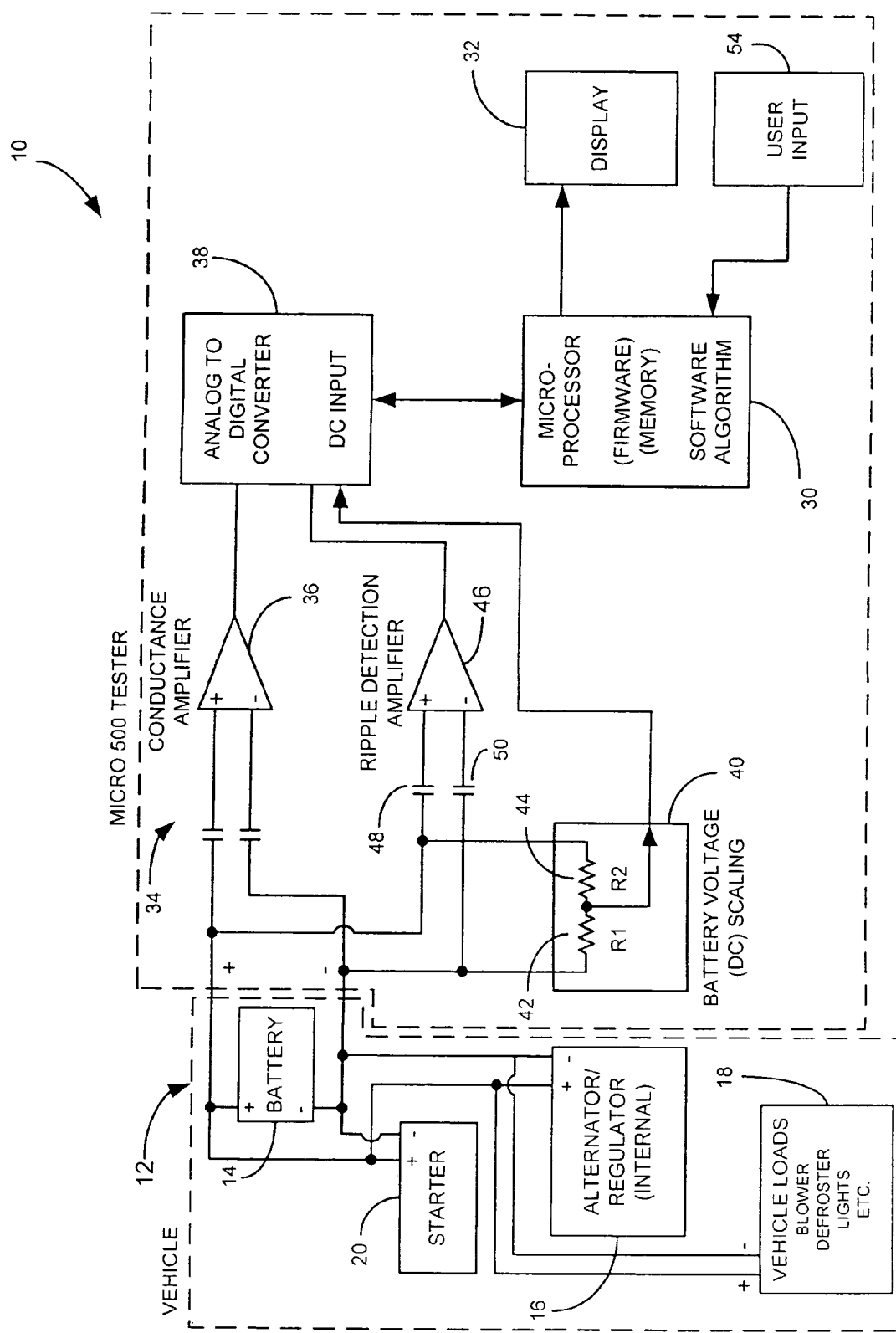
FIG. 1 is a simplified block diagram of an automotive battery charging system tester in accordance with the present invention.

FIG. 1 is a simplified block diagram of a battery charging system tester 10 in accordance with one embodiment of the present invention coupled to a vehicle 12. Vehicle 12 includes a battery 14 having positive and negative terminals, an alternator with internal regulator 16, various vehicle loads 18, and a starter motor 20. In operation, battery 14 provides power to starter 20 and vehicle loads 18 when the engine in vehicle 12 is not running. When the engine in vehicle 12 is running, alternator 16 is used to power vehicle loads 18 and provide a charging current to battery 14 to maintain the charge of battery 14.

Charging system tester 10 includes a microprocessor 30 which controls operation of tester 10 and provides instructions and test result information to an operator through, for example, a display 32. Tester 10 includes a battery testing section 34 which is illustrated generally as conductance amplifier 1. Section 34 operates in accordance with, for example, the conductance based battery testing techniques described in Champlin patents U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,11, issued Nov. 5, 1996, entitled ELECTRONIC BATTERY TESTER WITH AUTOMATIC COMPENSATION FOR LOW STATE-OF-CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,598,098, issued Jan. 28, 1997, entitled ELECTRONIC BATTERY TESTER WITH VERY HIGH NOISE IMMUNITY; U.S. Pat. No. 5,821,756, issued Oct. 13, 1998, entitled ELECTRONIC BATTERY TESTER WITH TAILORED COMPENSATION FOR LOW STATE-OF-CHARGE. Section 34 is illustrated in very simplified form and conductance amplifier 1 provides an output to an analog to digital converter 38 which is related to the internal conductance of battery 14.

A DC voltage sensor 40 includes voltage scaling resistors 42 and 44 and is coupled to battery 14 to provide an output to analog to digital converter 38 which is representative of the DC voltage across battery 14. Further, an AC ripple detector amplifier 46 is coupled to battery 14 through capacitors 48 and 50 and provides an output to analog to digital converter 38 which is representative of the AC ripple voltage across battery 14.

Microprocessor 30 controls analog to digital converter 38 to select which of the three inputs to digitize. Microprocessor 30 includes firmware, memory, and a software program in accordance with the invention. The user input 54 is coupled to microprocessor 30 to provide the information to microprocessor 30 from an operator.

Preferably, tester 10 is portable such that it may be easily moved between vehicles or otherwise transported. Portability of tester 10 is achieved because tester 10 does not require large internal carbon pile loads to load the battery charging system. Instead, as described herein, tester 10 utilizes loads internal to the vehicle 12 in testing the charging system. Further, the battery tester performed by tester 10 is in accordance with the non-load battery testing technique as described above.

Figure 2:
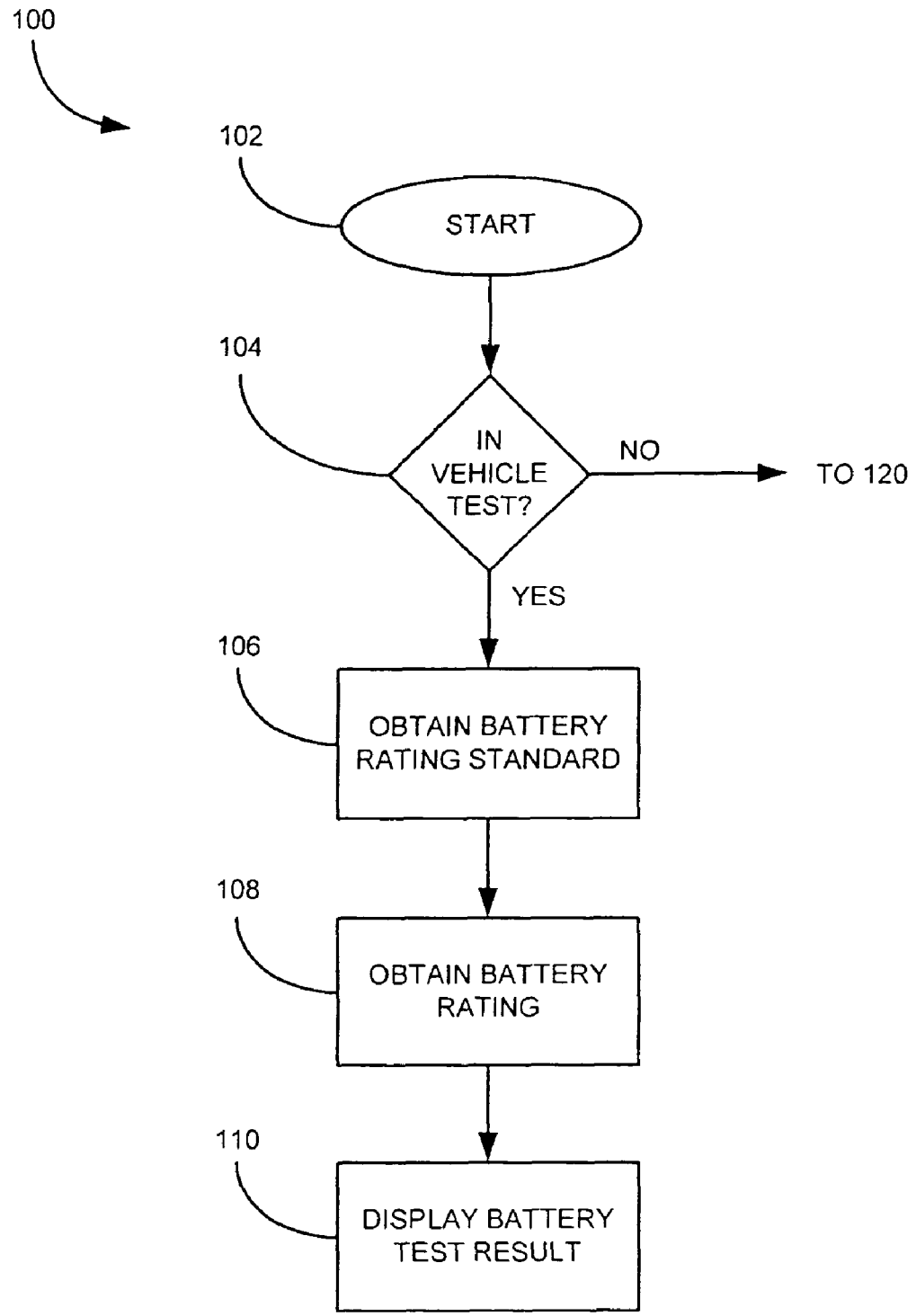
FIG. 2 is a simplified flow chart showing steps in a battery test.

FIGS. 2-8 are simplified block diagrams illustrating steps in accordance with the invention. User input for the steps can be through user input device 54 and a display can be provided through display device 32. In FIG. 2, block diagram 100 begins at start block 102. At block 104 the type of vehicle test is selected. If it is an in-vehicle test, control is passed to block 106. If it is an out of vehicle test, control is passed to block 120. At block 106, the user is prompted to input the battery rating standard to be used for the test. Various standards include SAE, DIN, IEC, EN, JIS or a battery stock number. At block 108, the user is prompted to input the battery rating according to the selected standard. A battery test is then performed at block 110, the results of the battery test are displayed including battery voltage, battery cold cranking amps, and a general condition of the battery such as good, good but recharged, charged and retest, replace battery or bad cell-replace. Any type of battery test may be used, however, conductance, resistance, impedance or admittance based testing as described in the Champlin and Midtronics patents is preferred.

Figure 3:
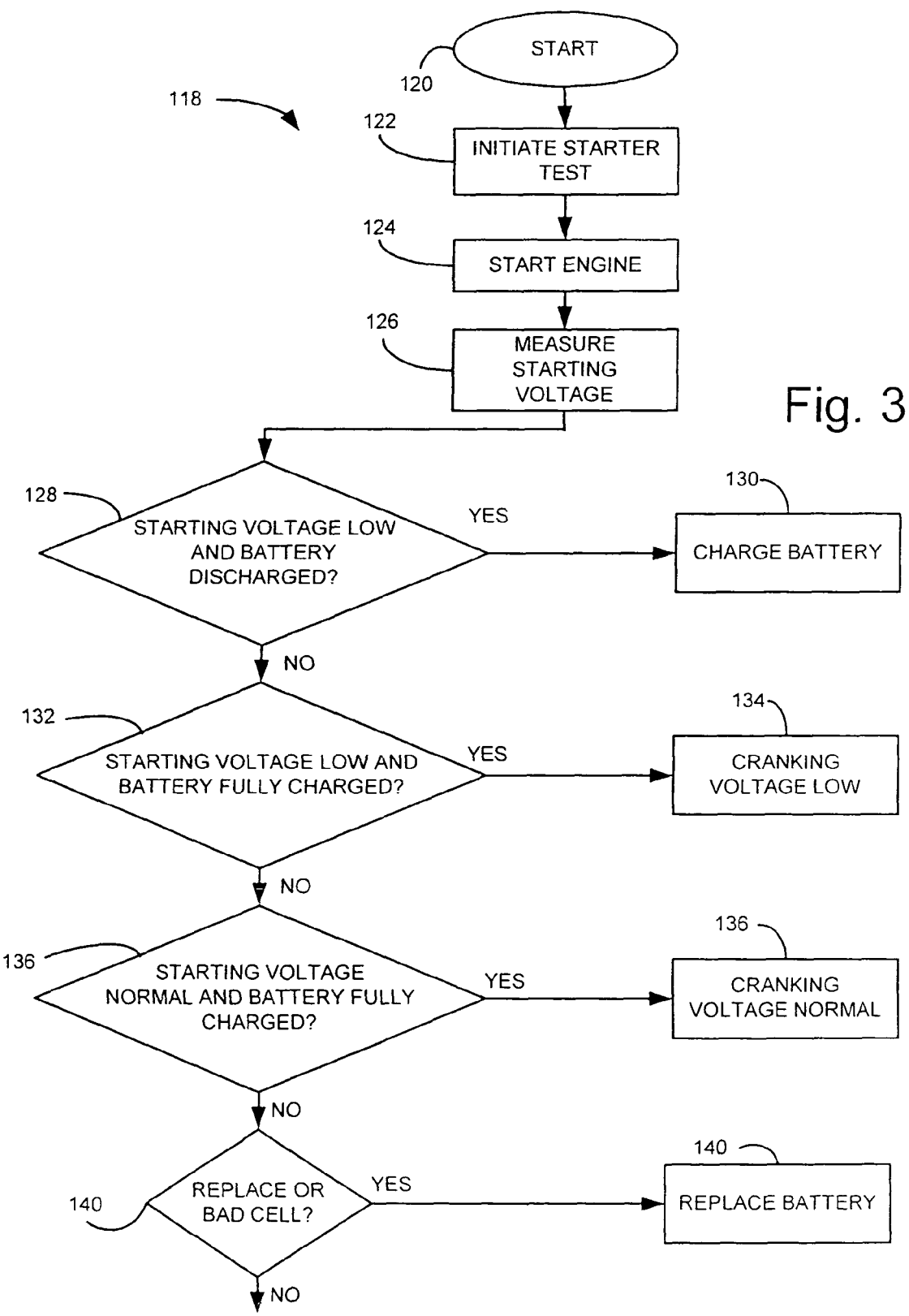
FIG. 3 is a simplified flow chart showing steps in a starter test.

FIG. 3 is a simplified block diagram 118 for an in-vehicle test. When the user initiates a starter test, for example through an input through user input 54, control is passed to block 124 and the operator is instructed to start the engine. Microprocessor 30 detects that the engine is being started by monitoring the resultant in drop in voltage across battery 14. The starting voltage is measured at block 126. Once the engine starts, and the voltage begins to rise, the tester 10 will display one of four different test results. At block 128, if the starting voltage is low and the battery is discharged, the message "charge battery" is displayed at block 130. At block 132, if the starting voltage is low and the battery has a full charge, the message "cranking voltage low" is displayed at block 134 along with the measured voltage. If at block 11, the starting voltage is normal and the battery has a full charge, block 138 displays cranking voltage normal along with the measured voltage. If, at block 140, the battery test result was either replaced or bad cell, block 142 displays the message replace battery. The low and normal cranking voltages can be selected as desired and using known techniques.

Figure 4:
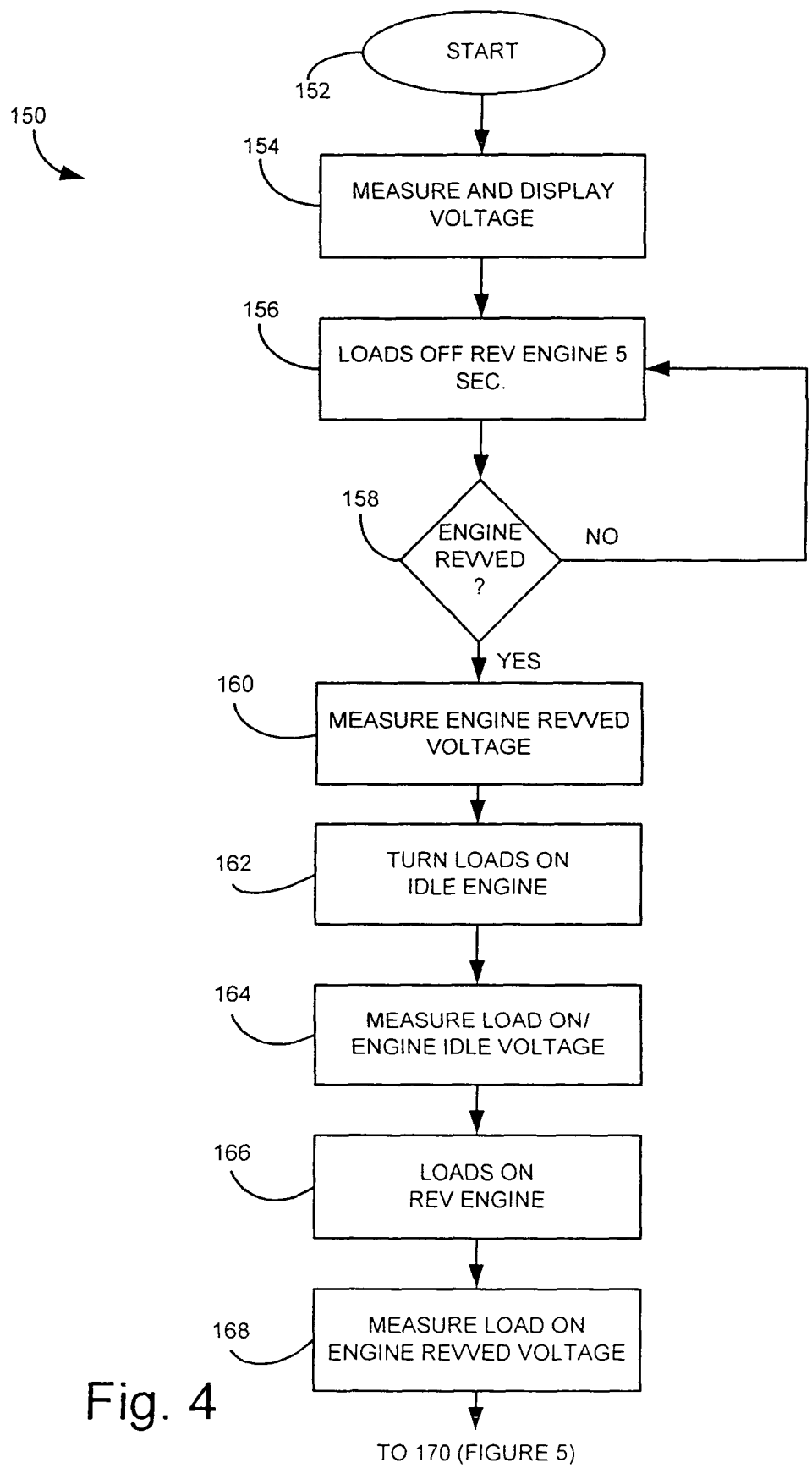
FIG. 4 is a simplified flow chart showing steps in a charging system test.
Figure 5:
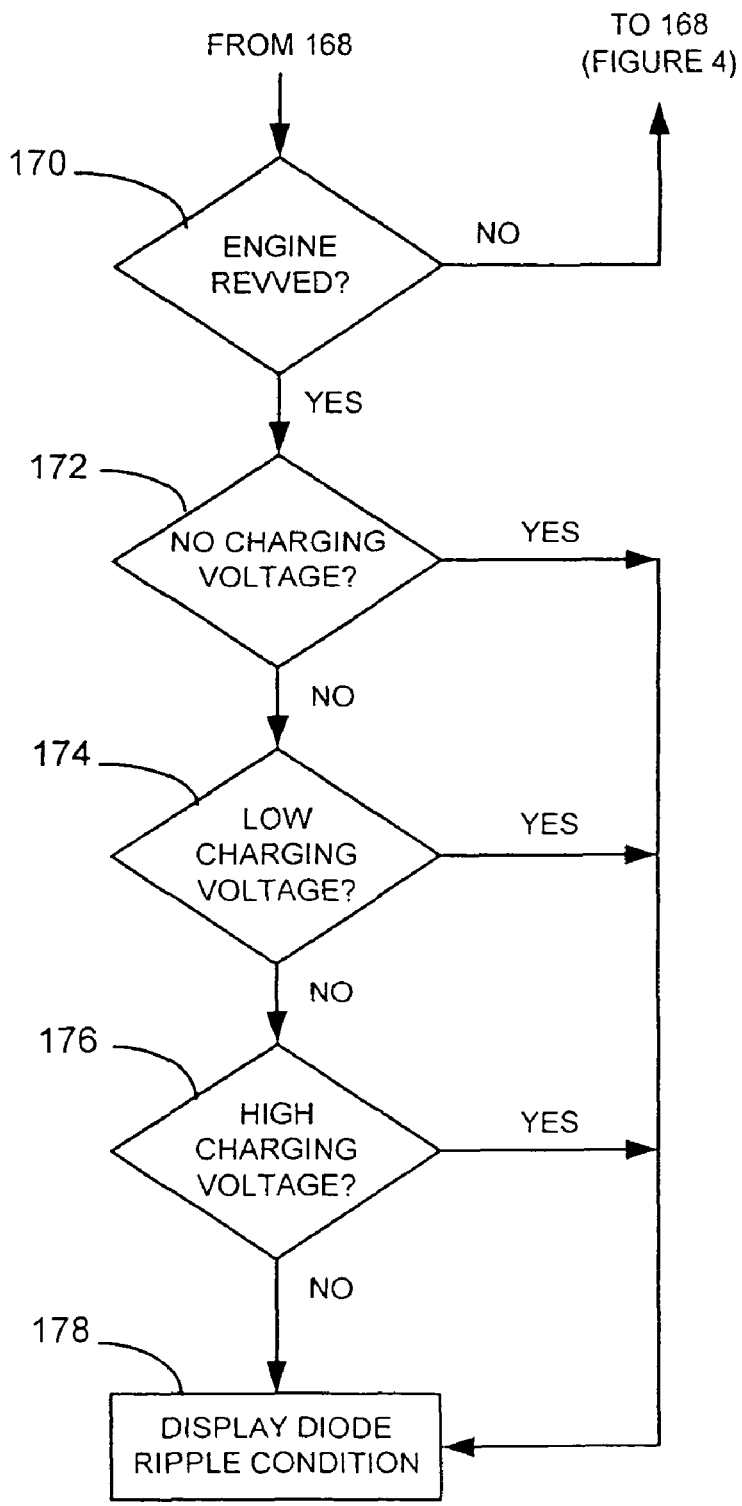
FIG. 5 is a simplified flow chart showing further steps in the charging system test of FIG. 4.

FIG. 4 is a block diagram 150 which illustrates steps in a charging system test in accordance with another aspect of the invention. At block 152, the procedure is initiated by the operator while the engine in vehicle 12 is running. At block 154, the voltage across battery 14 due to alternator 16 is measured and displayed. The operator may press and enter button on user input 54 to continue operation and at block 156 the operator is instructed to turn off all vehicle loads and rev the engine for 5 seconds. At block 158, the revving of the engine is detected by monitoring the AC ripple across battery 14 using ripple detection amplifier 46. If, after 30 seconds, microprocessor 30 does not detect engine revving, control is returned to block 156 and the procedure is repeated. At block 160, the engine revved voltage is measured and control is passed to block 162 where the operator is instructed to turn loads within the vehicle (i.e., headlights, fans, etc.) on and idle the engine. Again, an enter key on user input 54 is pressed and control is passed to block 164 and tester 10 measures the load on, engine idle voltage. At 166, the user is instructed to rev the engine with the loads on and another voltage is obtained at block 168. Control is then passed to block 170 in FIG. 5 and it is determined whether the engine speed has increased. At block 172, if there is no charging voltage, that is i.e., the charging voltage is less than or the same as the idle voltage, an output is displayed. Similarly, if the charging voltage is low such that the total voltage across the battery is less than, for example, 13 volts, an output is displayed. At block 176, if a high charging voltage is detected, such as more than 2.5 volts above the idle voltage, an output is displayed. When control reaches block 178, an output is provided indicative of the diode ripple voltage. This voltage can be obtained during any of the measurements where the engine is revved. If the ripple voltage is greater than, for example, 130 mV, an indication is provided that there is a diode or a stator problem.

Figure 6:
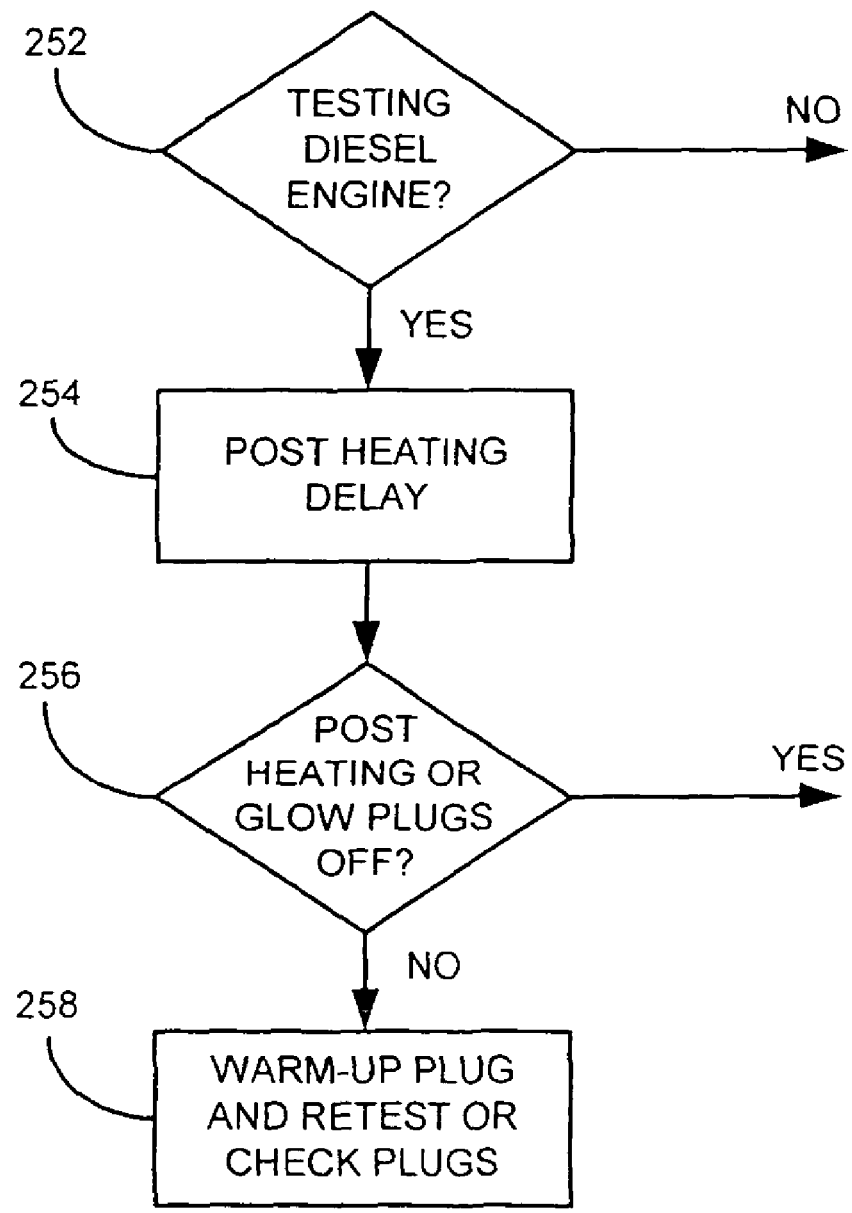
FIG. 6 is a simplified flow chart showing steps in a diesel engine charging system test.
Figure 7:
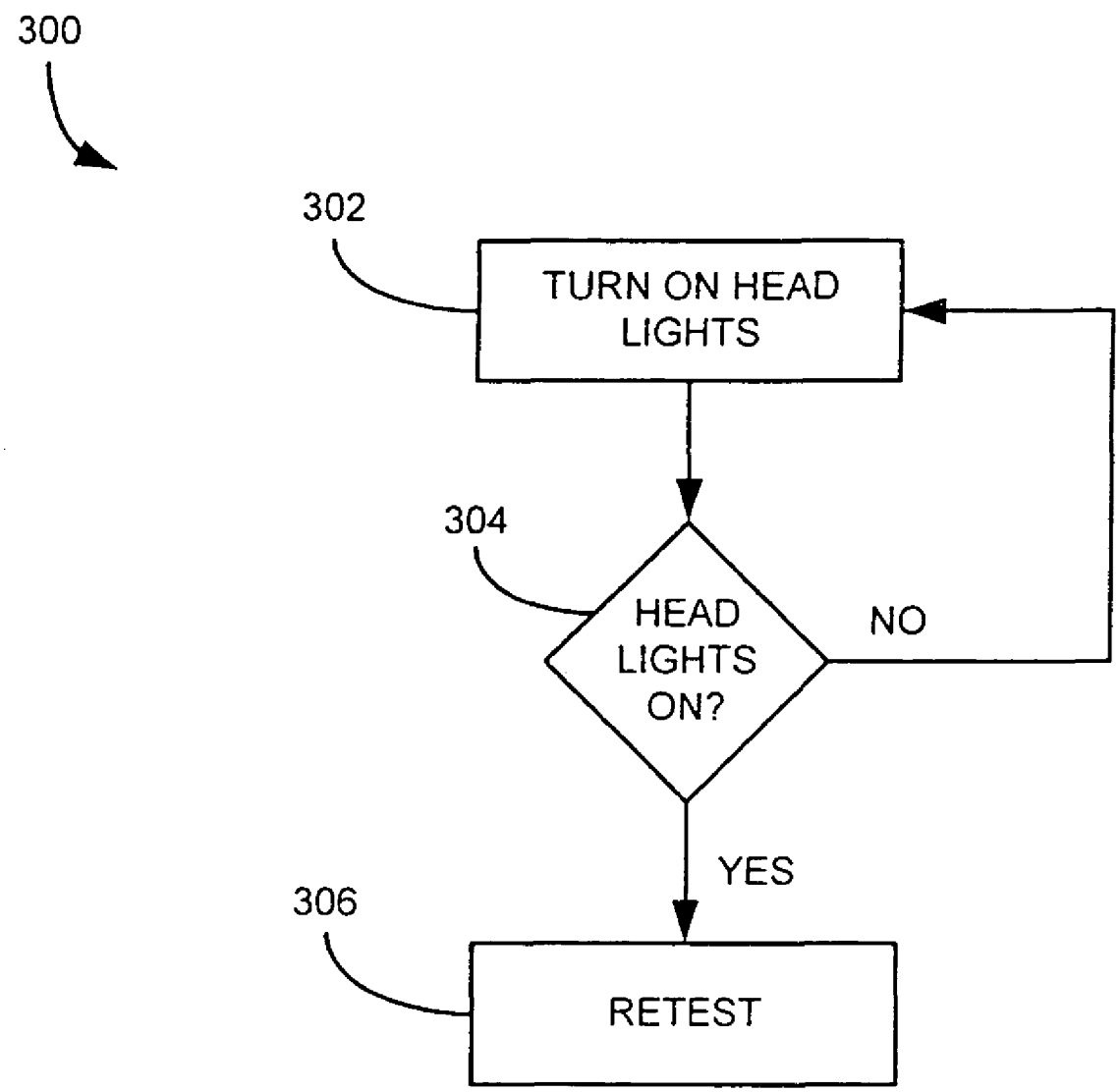
FIG. 7 is a simplified flow chart showing steps to remove surface charge.

FIG. 6 is a block diagram of a diesel test algorithm 250. If the tester 10 does not detect a charging or a ripple voltage, the tester begins the diesel test algorithm shown at 250. This allows the glow plugs of a diesel engine to turn off. If, at any time during the procedure, a charging voltage and a ripple are detected, the normal test procedure will resume. At block 252, the user is asked to input information as to whether the engine under test is a diesel engine. If the engine is not a diesel engine, a charging system problem is indicated. If the engine is diesel, control is passed to block 254 and a post heating delay, such as 40 seconds, passes at block 256, if there is a post heating or glow plugs off condition, then a charging system problem is indicated. If there is a post heating or glow plug on condition, the operator is instructed to warm up the plugs and retest, or check the glow plugs.

Additionally, the tester 10 can receive a temperature input from the operator and adjust the battery test appropriately.

If the battery test indicates that the battery may have been charged before testing, the user is prompted to indicate whether the test is being performed before charging the battery or after charging the battery and the system is retested.

Figure 8:
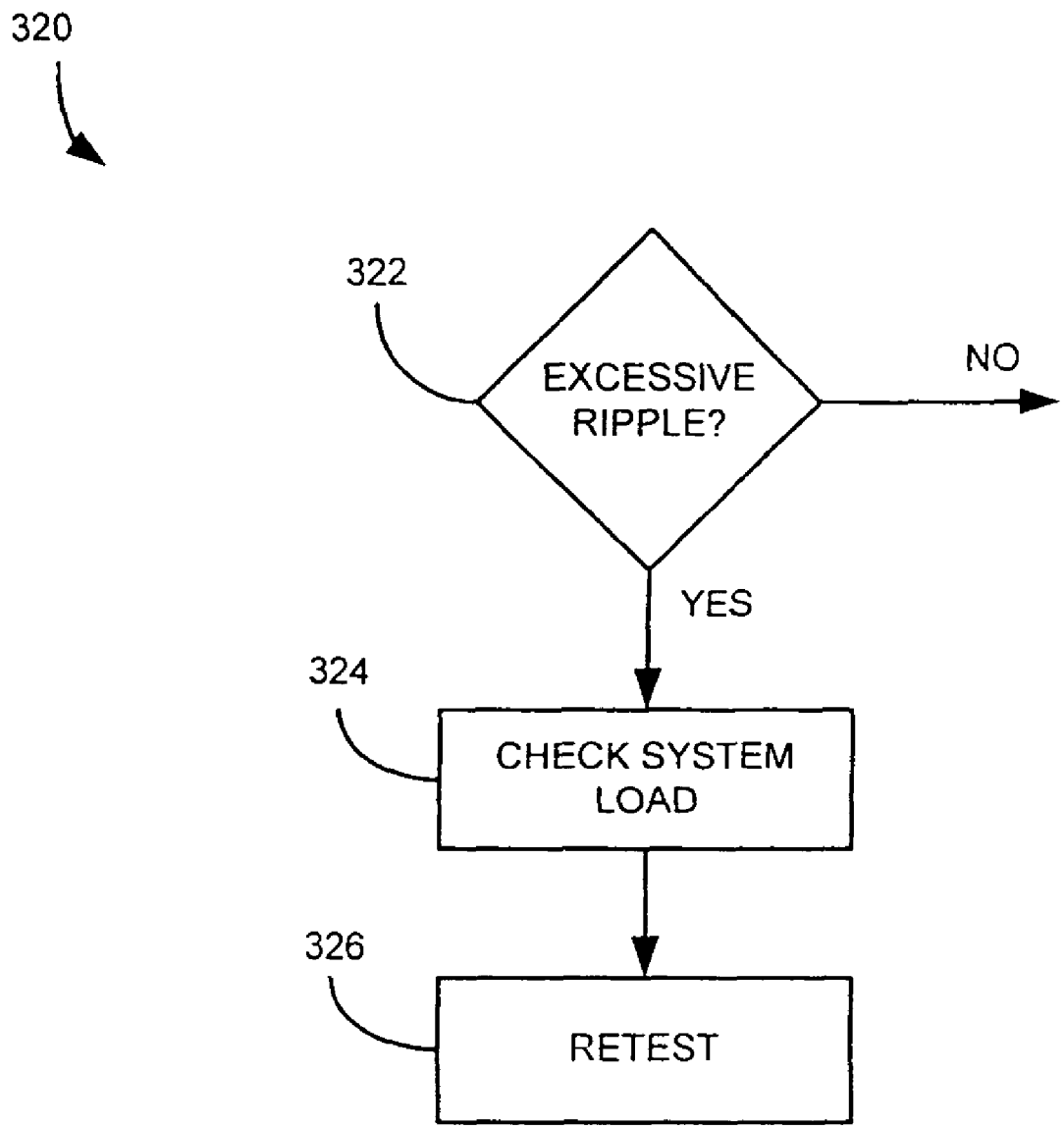
FIG. 8 is a simplified flow chart showing a ripple test.

If the tester 10 determines that the battery may have surface charge, the operator is instructed to turn on the vehicle head lights as indicated in flow chart 300 at block 302. If a drop in voltage is detected at block 304 indicating that the head lights have been turned on, control is passed to block 306. If, however, the head lights have not been turned on, control is returned to block 302. At block 306, the system is retested. Flow chart 320 of FIG. 8 shows a noise detection algorithm. If excessive ripple is detected during engine idle periods at block 322, the operator is instructed to check system loads at block 324. At block 326, the system is retested.

Based upon the test, an output can be printed or otherwise provided to an operator indicating the results of the battery test, the battery rating, the actual measured battery capacity, the voltage, the voltage during cranking and whether the cranking voltage is normal, the condition of the charging system along with the idle voltage and the load voltage and the presence of excessive diode ripple.

In general, the present invention provides the integration of an alternator test with a battery test, an alternator test with a starter test, a starter test with an battery test, or an alternator test with a battery test and with a starter test. The invention allows information from any of these tests to be shared with the other test(s).

In one aspect, tester 10 measures the voltage across battery 20. Both the AC and DC voltages are recorded. The AC voltage is used to identify alternator diode and stator faults. The DC voltage measurement is used to determine if the charging system is functioning properly. The electrical loads of the vehicle are used to load the alternator for convenience. However, other types of loads can also be applied. The tester continually monitors the charging voltage across the battery. The operator is instructed to turn on vehicle loads and rev the engine. The charging voltage is recorded with the engine revved. In a properly functioning charging system, this charging voltage should be greater than the measured battery voltage with the engine off. This indicates that current is flowing into the battery and thus the battery is being charged even with loads applied to the charging system. This testing principle does not require knowledge of the alternator size, or even the amount of current that the alternator is producing. In the testing, various DC voltages across the battery are measured including battery voltage with the engine off (stead state voltage), battery voltage with the engine running at idle (idle voltage), battery voltage with the engine revved, for example between 1,000 RPM and 2,500 RPM, and the vehicle loads off and battery voltage with the engine revved and vehicle loads on. The AC voltage across the battery which is measured with the engine running is used to detect excessive ripple which may be caused by a faulty diode or stator. Ripple of over about 130 mV is indicative of a diode or stator problem. Additionally, the ripple can be used by tester 10 to detect changes in engine RPM.

An initial revving of the engine can be used prior to returning to idle to ensure that the alternator field circuit is excited and conducting current. If the idle voltage with the loads off is less than or equal to the steady state voltage, then a charging problem exists. If the charging voltage exceeds the steady state voltage by more than, for example, 0.5 volts, then a regulator problem is indicated.

With the engine revved and the vehicle loads (such as head lights, blower, rear defrost, etc.) turned on, the revved and loaded voltage across the battery is recorded and compared to the steady state battery voltage. If the charging voltage with loads turned on while the engine is revved is not greater than the steady state voltage, then current is not flowing into the battery and the battery is not being charge. This indicates a problem and that the alternator cannot meet the needs of the vehicle while still charging the battery.

With the present invention, the battery test can be used to prevent incorrectly identifying the charging system as being faulty. Thus, the battery test ensures that a good battery is being charged during the charging system test. The measurement of the cranking voltage while the engine is being started is used to determine whether there is a starter problem. In diesel engine applications, the charging system voltage is measured to determine if the engine glow plug operation is effecting the charging system test result. A long cabling (i.e., 10 to 15 feet) can be used such that the tester 10 can be operated while sitting in the vehicle. The battery testing is preferably performed by measuring the conductance, impedance, resistance or admittance of the battery. Further, the battery test with the engine off can be compared with the battery test with the engine on and used to diagnosis the system.

Although the present invention has been described with reference to preferred embodiments, workers skilled in the art will recognize that changes may be made in form and detail without departing from the spirit and scope of the invention.

What is claimed is:

1. An apparatus for testing a charging system of an automotive vehicle, comprising:
   electrical connections configured to couple to a battery of the vehicle;
   a user input configured to receive a battery rating from an operator;
   a display configured to display information to the operator; and
   a microprocessor configured to:
      prompt the operator to input rating information for the battery using the input;
      receive the rating information for the battery from the operator from the input;
      perform a battery test on the battery through the electrical connections to the battery;
      measure a dynamic parameter of the battery through the electrical connections to the battery;
      determine a condition of the battery by comparing the measured dynamic parameter to the received rating, the battery test result indicative of a battery condition, the battery condition including a fully charged battery and a battery which is not fully charged;
      detect revving of the engine by observing an increased frequency of an AC ripple of a voltage measured through the electrical connectors to the battery;
      detect a diode or stator problem if the AC ripple exceeds a threshold;
      instruct the operator to start an engine of the vehicle through the display;
      detect starting of the engine of the automotive vehicle by the operator by a drop in a voltage measured through the electrical connections to the battery;
      measure a starting voltage through the electrical connections to the battery during starting of the engine of the automotive vehicle; and provide a charge battery output to the operator through the display if the measured starting voltage is low relative to a threshold and the battery test result is indicative of a battery which is not fully charged,
      provide a cranking voltage low output to the operator through the display if the measured starting voltage is low relative to a threshold and the battery test result is indicative of a fully charged battery;
      provide a cranking voltage normal output to the operator through the display if the starting voltage is normal relative to a threshold and the battery test result is indicative of a fully charged battery.

2. The apparatus of claim 1 wherein the user input is further configured to receive a rating standard selection from the user.

3. The apparatus of claim 2 wherein the rating standard selection comprises an SAE standard.

4. The apparatus of claim 2 wherein the rating standard selection comprises a DIN standard.

5. The apparatus of claim 2 wherein the rating standard selection comprises an IEC standard.

6. The apparatus of claim 2 wherein the rating standard. selection comprises an EN standard.

7. The apparatus of claim 2 wherein the rating standard selection comprises a JIS standard.

8. The apparatus of claim 1 wherein the battery test is based upon conductance.

9. The apparatus of claim 1 wherein the battery test is based upon resistance.

10. The apparatus of claim 1 wherein the battery test is based upon impedance.

11. The apparatus of claim 1 wherein the battery test is based upon admittance.

12. The apparatus of claim 1 wherein the microprocessor is configured to provide an output selected from the group of outputs consisting of cranking voltage indicating "good battery", "good but recharge battery", "charge and retest battery", "replace battery", and "bad cell-replace battery".

13. The apparatus of claim 1 wherein the microprocessor further measures a voltage when the engine of the vehicle is revved and no vehicle loads are applied.

14. The apparatus of claim 13 wherein the microprocessor further measures a voltage when the engine is idle and a vehicle load is applied.

15. The apparatus of claim 14 wherein the microprocessor further measures a voltage when the engine is revved and a vehicle load is applied.

16. The apparatus of claim 1 wherein the user input is configured to receive a temperature.

17. The apparatus of claim 1 wherein the battery test is a function of a temperature.

18. The apparatus of claim 1 wherein the microprocessor is configured to determine if surface charge exists on the battery.

19. The apparatus of claim 18 wherein the microprocessor prompts an operator to turn on headlights of the vehicle based upon a surface charge determination.

20. The apparatus of claim 1 wherein the output further comprises an output selected from the group of outputs consisting of measured capacity, voltage, voltage during cranking, idle voltage, and load voltage.

21. The apparatus of claim 1 wherein the microprocessor records AC and DC voltages in a memory.

22. The apparatus of claim 1 wherein the microprocessor records a voltage across the battery in a memory.

23. The apparatus of claim 1 including a battery voltage scaling circuit.

24. The apparatus of claim 1 including DC voltage sensor adapted to measure a DC voltage of the battery and an AC voltage ripple detector adapted to measure the AC ripple voltage.

25. The apparatus of claim 1 wherein the microprocessor measures a steady state battery voltage with the engine off, a battery voltage with the engine revved, a battery voltage with the engine idling and a load applied to the battery, and a battery voltage with this engine revved and a load applied to the battery.

26. The apparatus of claim 1 wherein the microprocessor is adapted to receive an input indicating that the vehicle contains a diesel engine and wherein the microprocessor waits for glow plugs of the diesel engine to warm up and charging to start prior to performing a test.

27. The apparatus of claim 1 wherein the tester is portable.

* * * * *